(12) United States Patent
Asra et al.

(10) Patent No.: US 10,373,942 B2
(45) Date of Patent: Aug. 6, 2019

(54) LOGIC LAYOUT WITH REDUCED AREA AND METHOD OF MAKING THE SAME

(71) Applicant: GLOBALFOUNDRIES Inc., Grand Cayman (KY)

(72) Inventors: Ram Asra, Clifton Park, NY (US); Mohit Bajaj, Bangalore (IN); Edward Nowak, Shelburne, VT (US); Kota V. R. M. Murali, Shrub Oak, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/829,459

(22) Filed: Dec. 1, 2017

(65) Prior Publication Data

US 2019/0172822 A1 Jun. 6, 2019

(51) Int. Cl.

| H01L 29/66 | (2006.01) |
|---|---|
| H01L 27/02 | (2006.01) |
| H01L 29/78 | (2006.01) |
| H01L 27/11 | (2006.01) |
| H01L 29/06 | (2006.01) |
| H01L 27/092 | (2006.01) |
| H01L 27/12 | (2006.01) |
| H01L 21/8238 | (2006.01) |
| H01L 29/423 | (2006.01) |

(52) U.S. Cl.
CPC .. *H01L 27/0207* (2013.01); *H01L 21/823821* (2013.01); *H01L 27/0924* (2013.01); *H01L 27/1104* (2013.01); *H01L 27/1211* (2013.01); *H01L 29/0649* (2013.01); *H01L 29/42356* (2013.01); *H01L 29/66545* (2013.01); *H01L 29/66795* (2013.01); *H01L 29/785* (2013.01)

(58) Field of Classification Search
CPC .......... H01L 27/0207; H01L 29/42356; H01L 21/823821; H01L 27/1211; H01L 27/0924; H01L 27/1104; H01L 29/785; H01L 29/66545; H01L 29/66795; H01L 29/0649

See application file for complete search history.

(56) References Cited

U.S. PATENT DOCUMENTS 9,356,027 B1    5/2016  Cheng et al.
10,096,607 B1 * 10/2018  Guillorn ............. H01L 21/8221

OTHER PUBLICATIONS

Zheng et al., "Simulation-Based Study of the Inserted-Oxide FinFET for Future Low-Power System-on-Chip Applications", Published in IEEE Electron Device Letters, vol. 36, Issue: 8, Aug. 2015, retrieved on Sep. 13, 2017, from http://ieeexplore.ieee.org/document/7115035/?tp=&arnumber=7115035, pp. 742-744.

* cited by examiner

*Primary Examiner* — David Vu
(74) *Attorney, Agent, or Firm* — Ditthavong & Steiner, P. C.

(57) ABSTRACT

A method of forming a SRAM semiconductor device with reduced area layout and a resulting device are provided. Embodiments include forming a first field effect transistor (FET) over a substrate; forming an insulating material over the first FET; forming a second FET over the insulating material; and patterning the first FET, insulating material and second FET to form fins over the substrate.

10 Claims, 36 Drawing Sheets

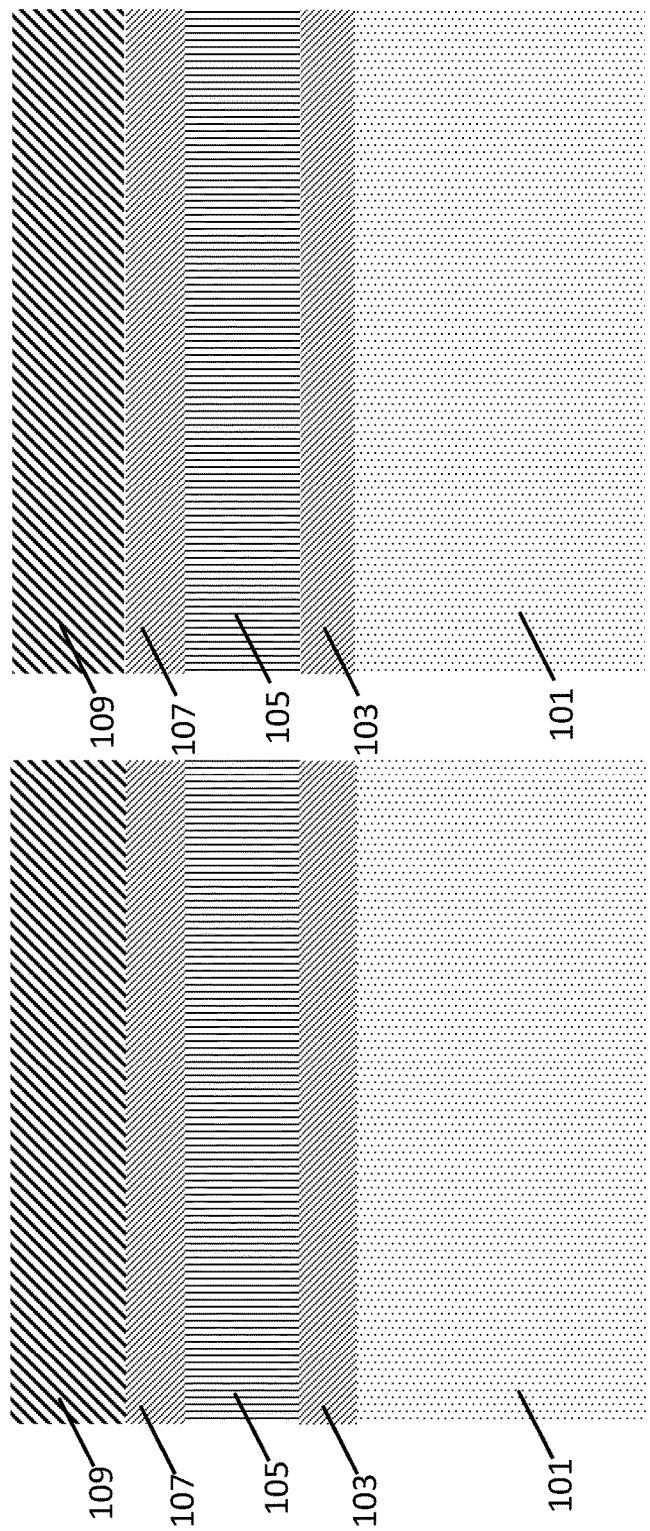

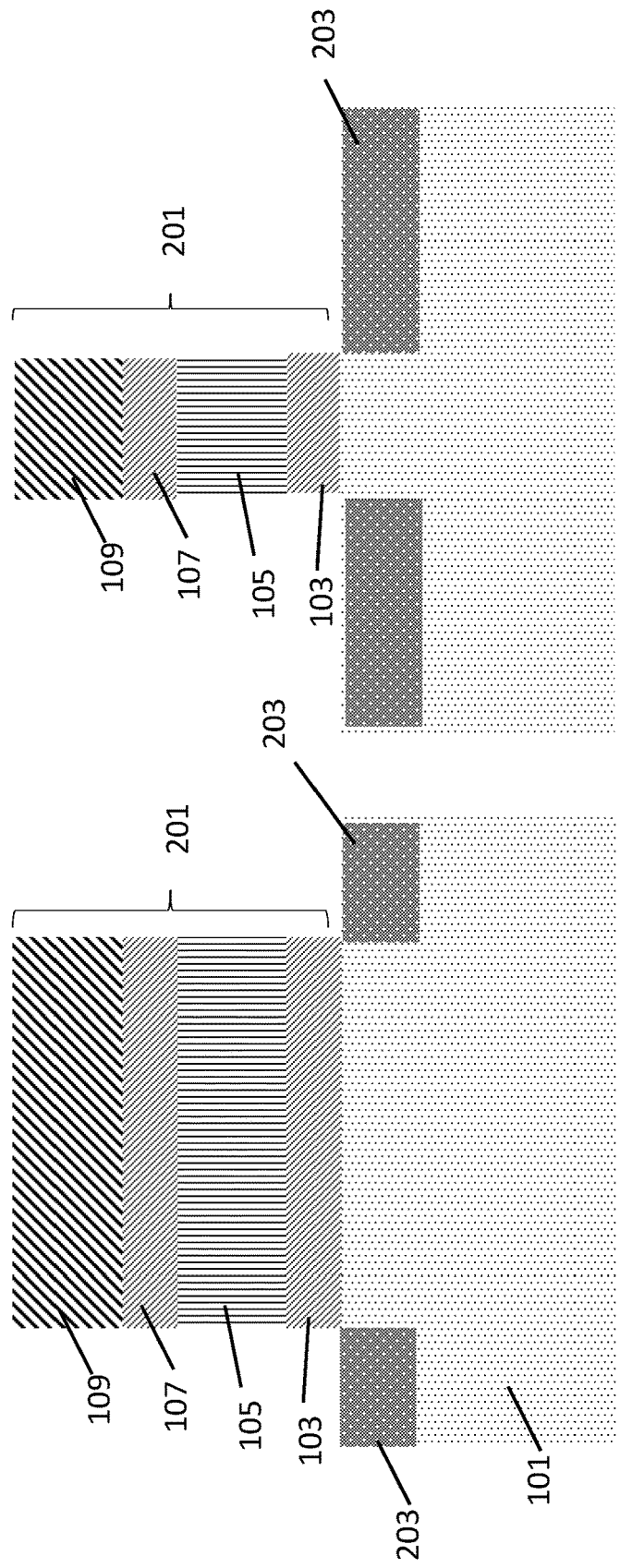

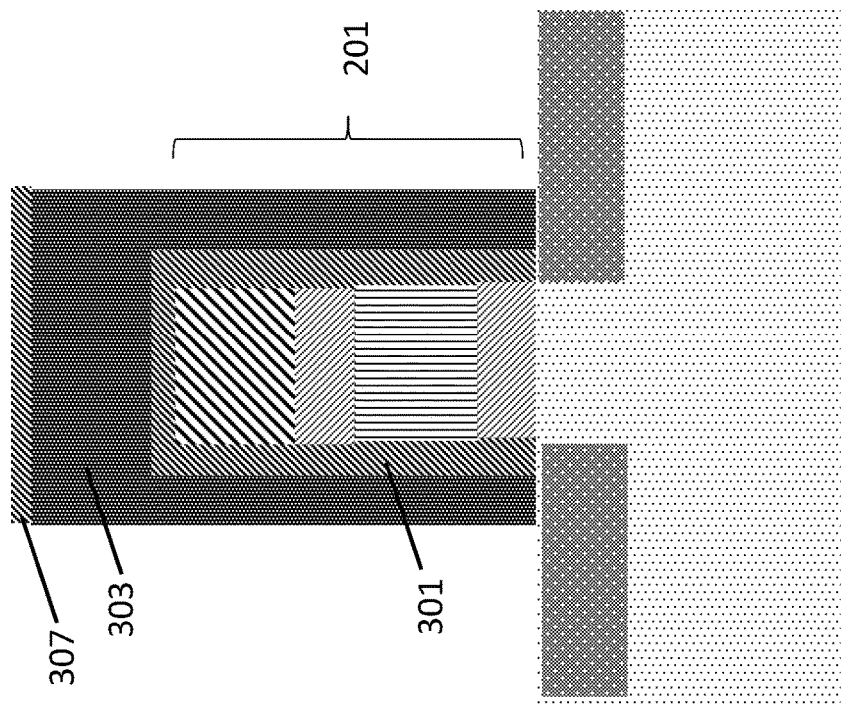
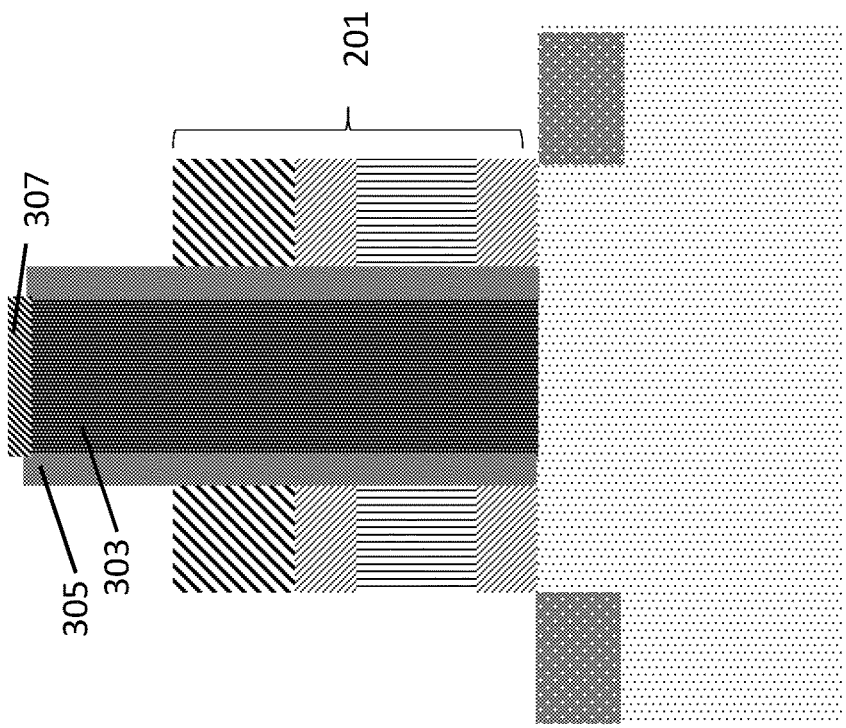

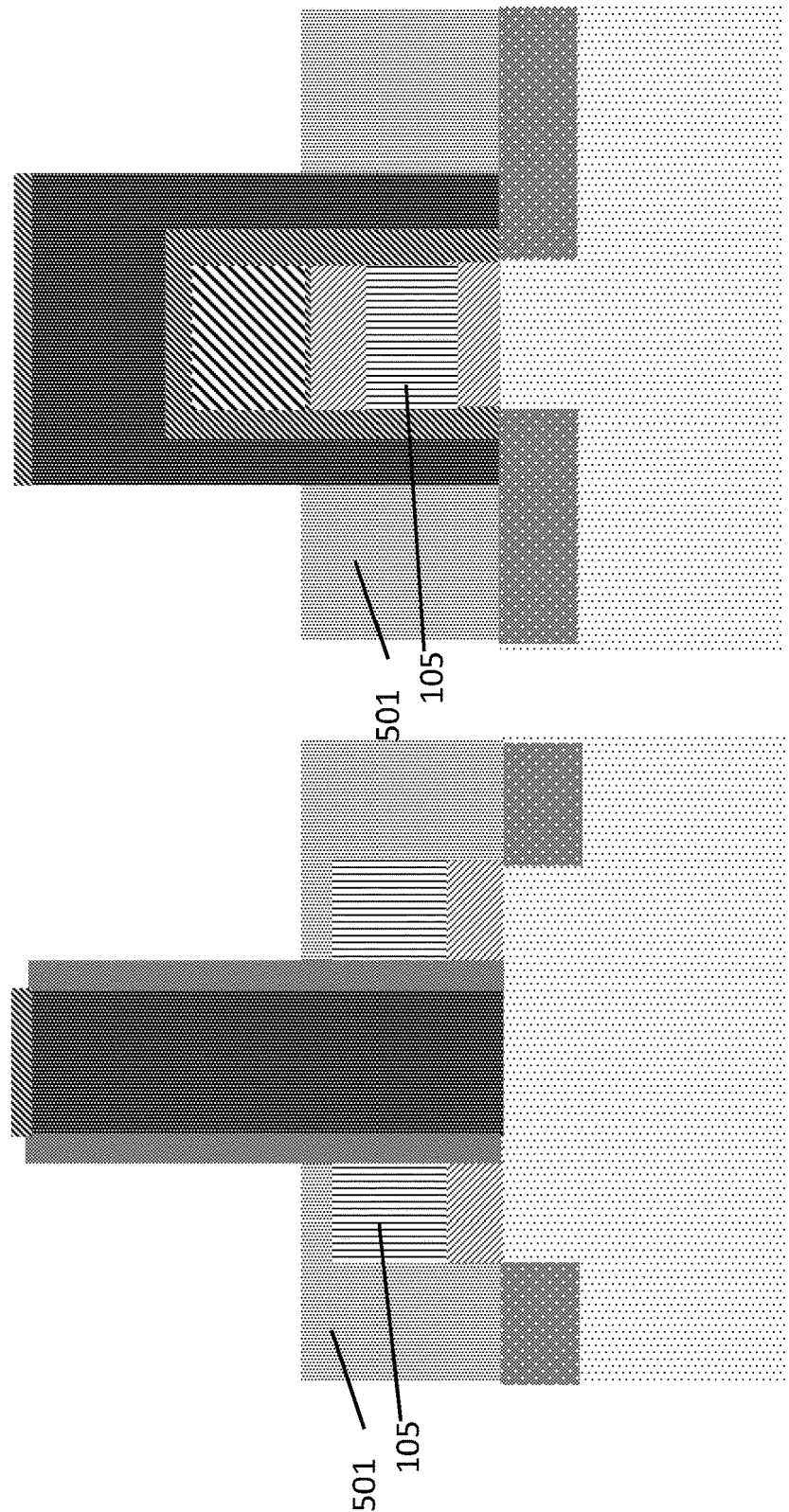

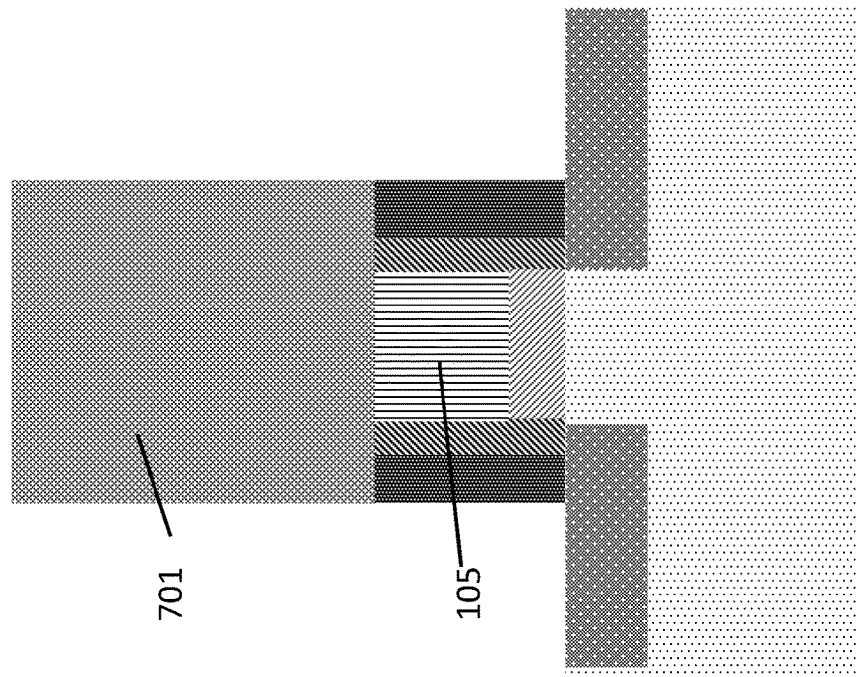
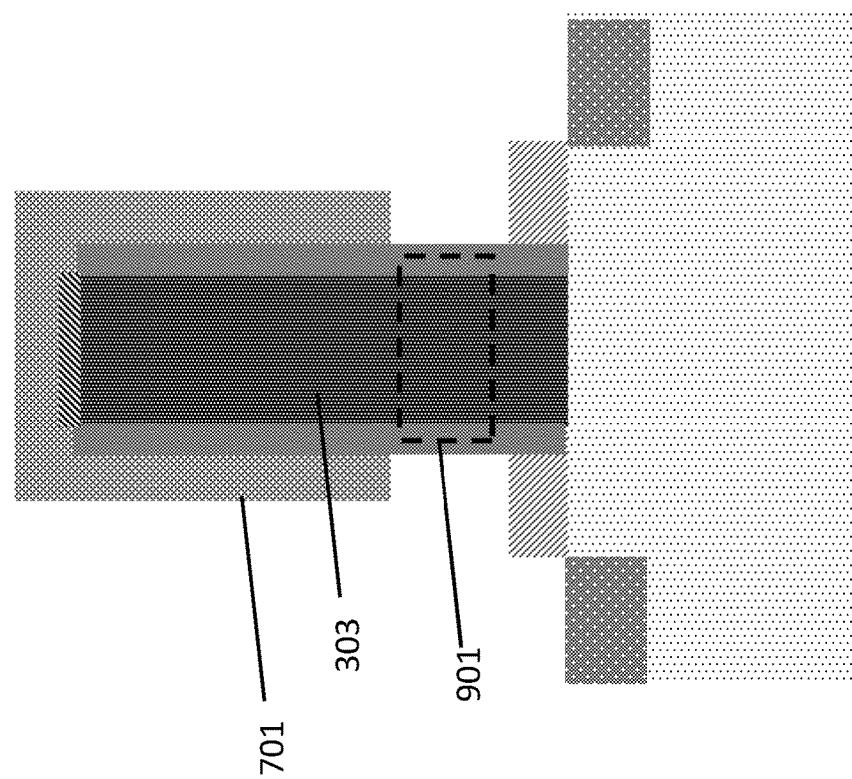

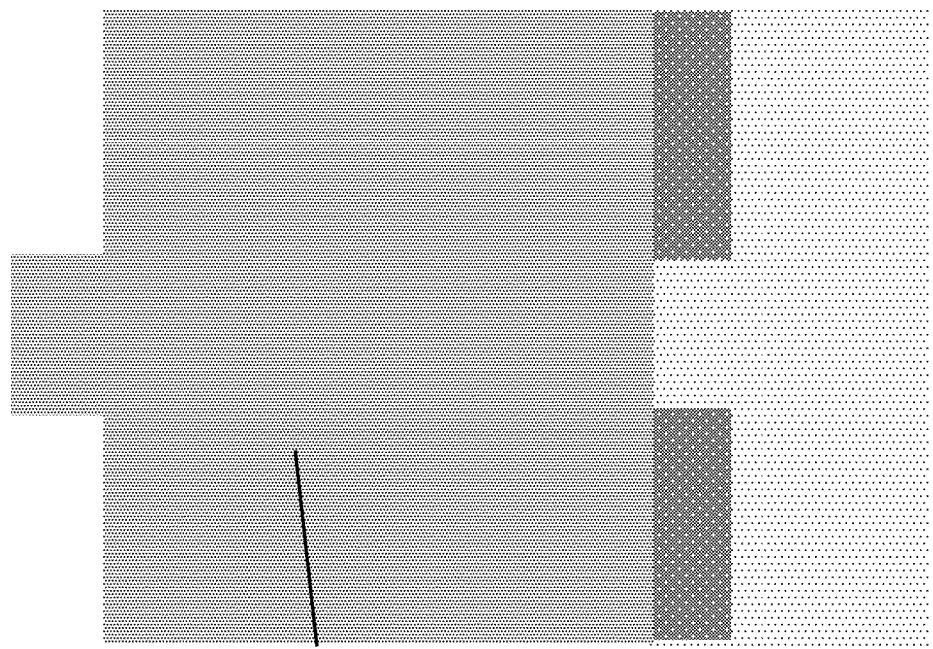
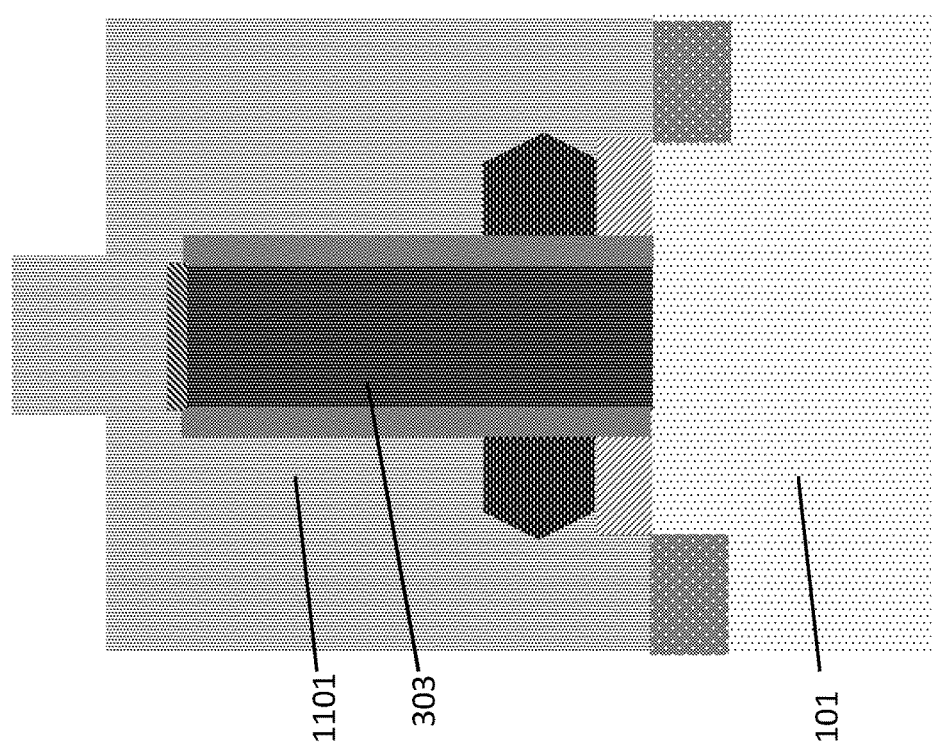
FIG. 11A
FIG. 11B

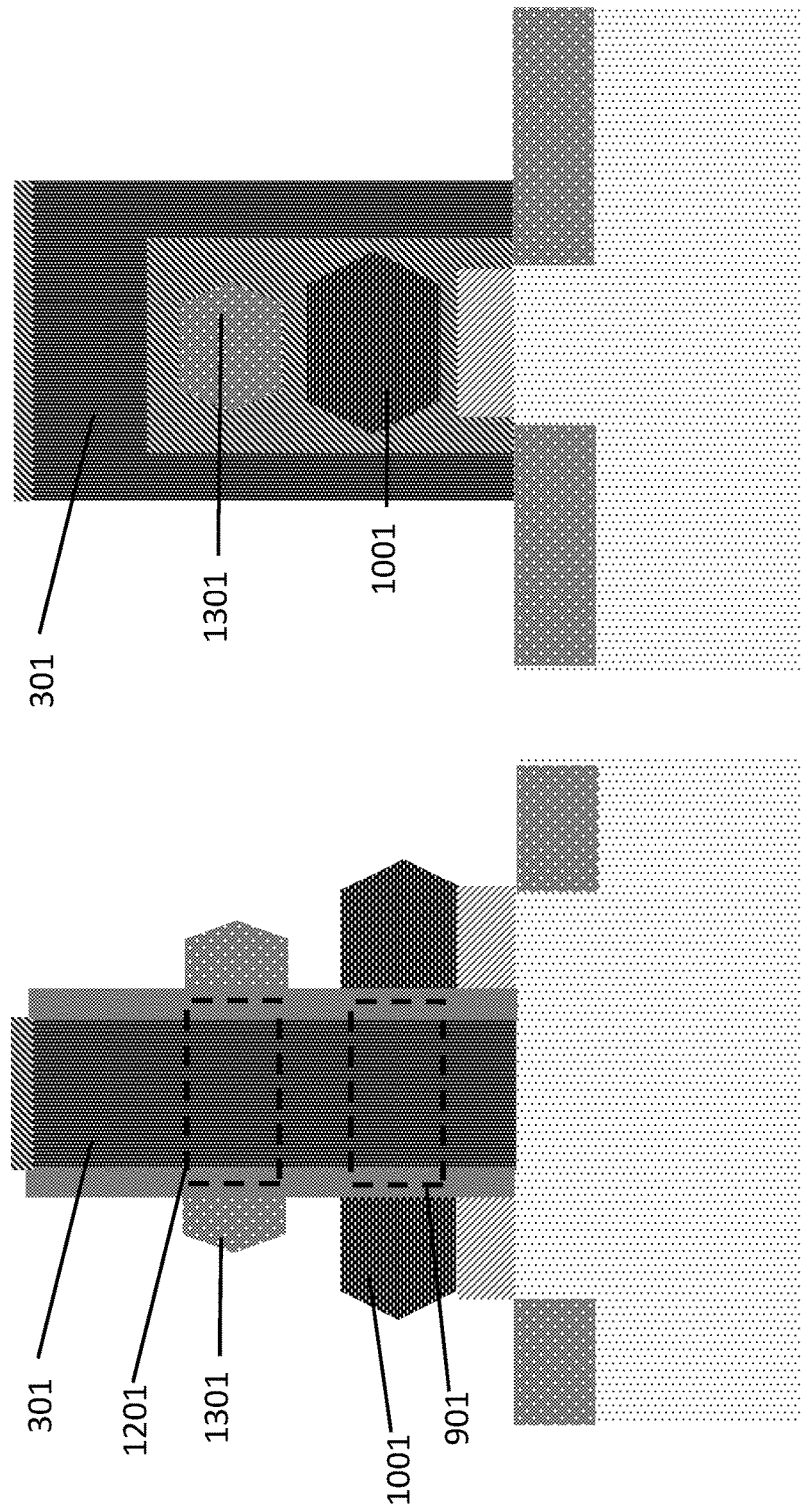

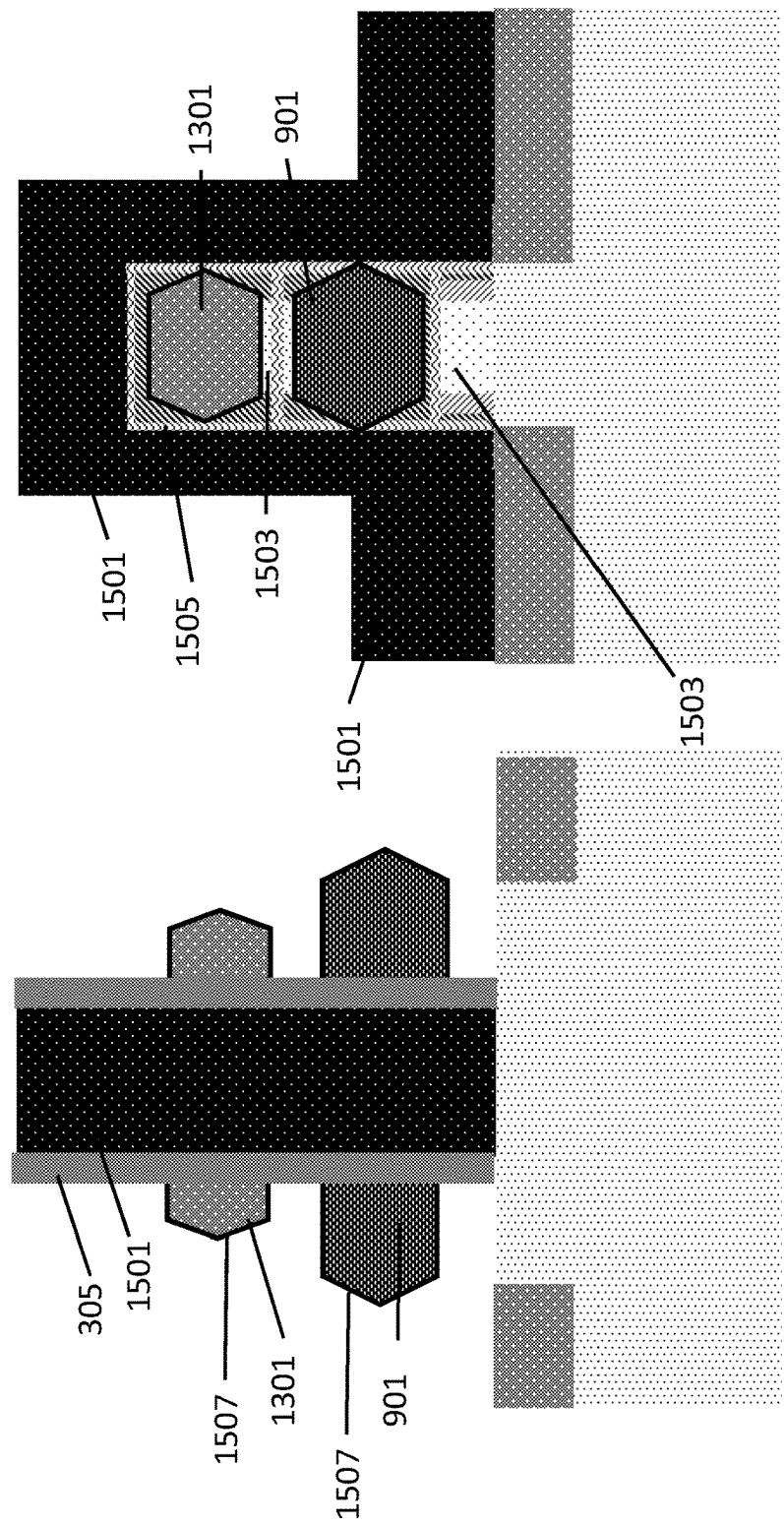

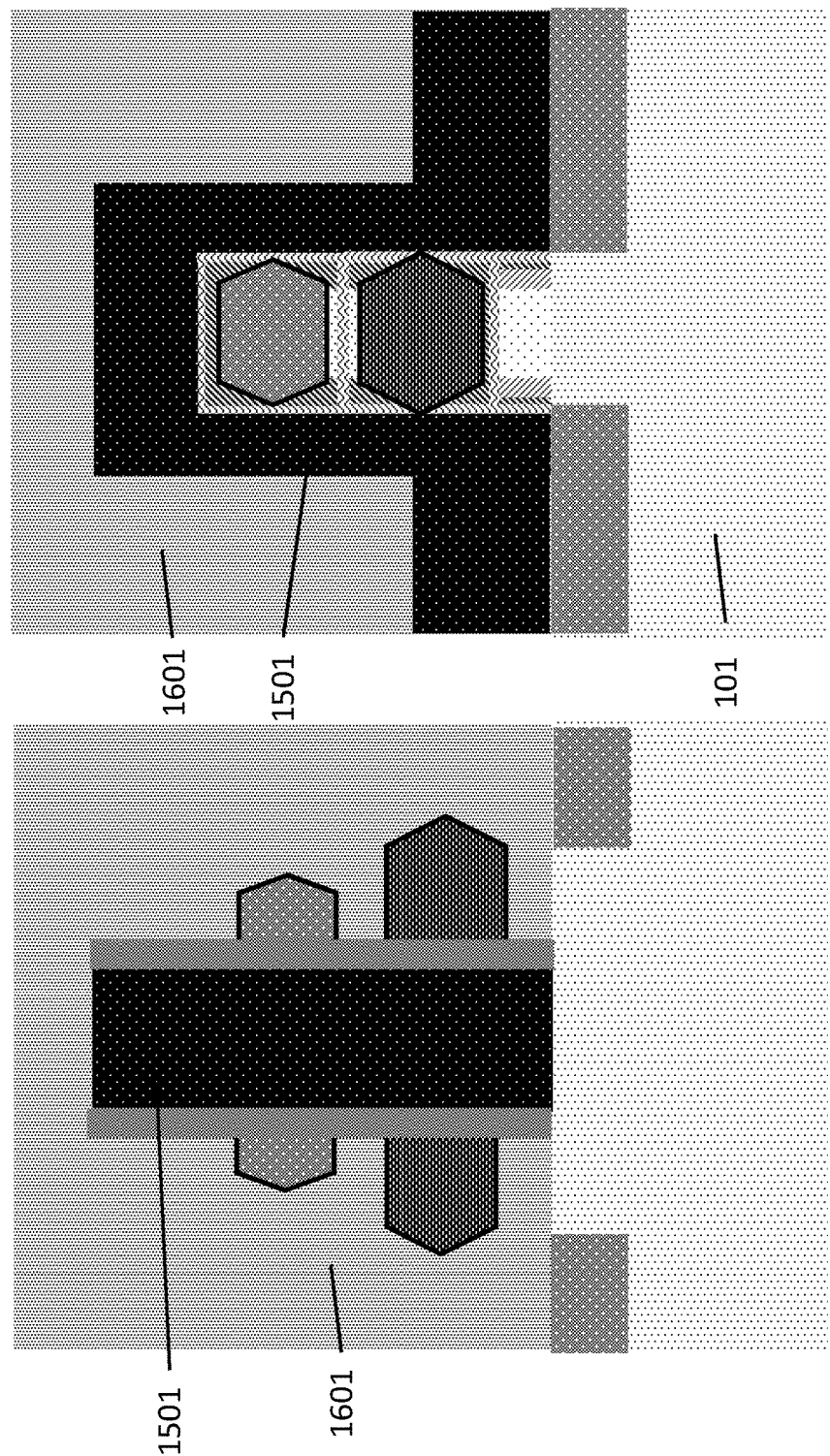

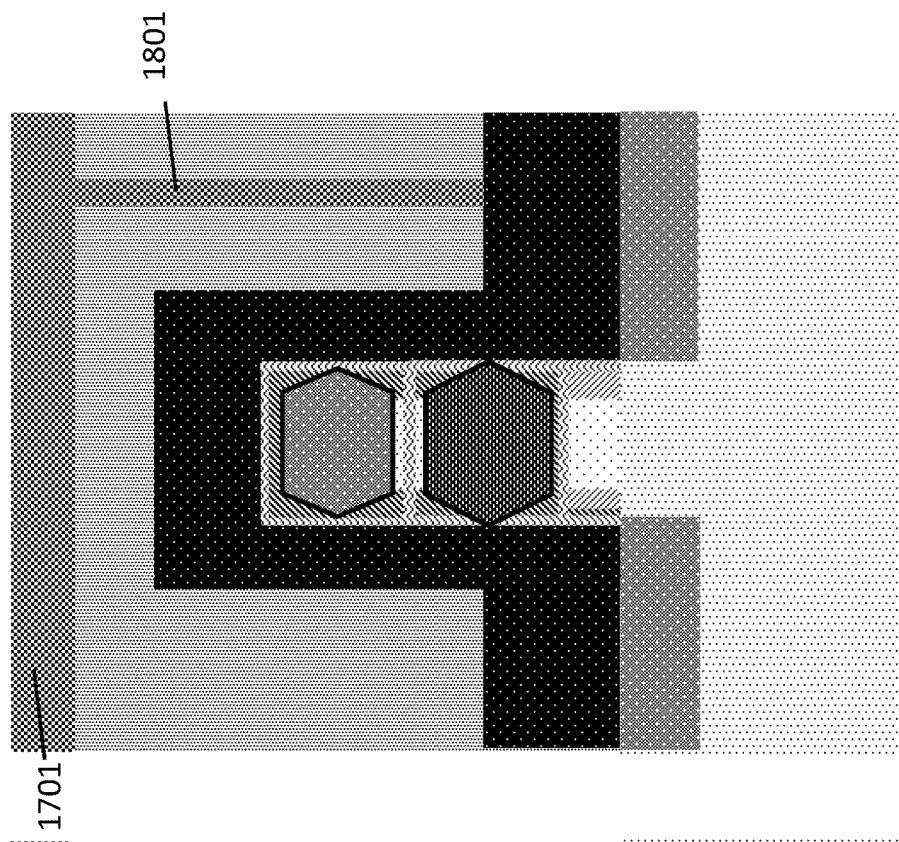
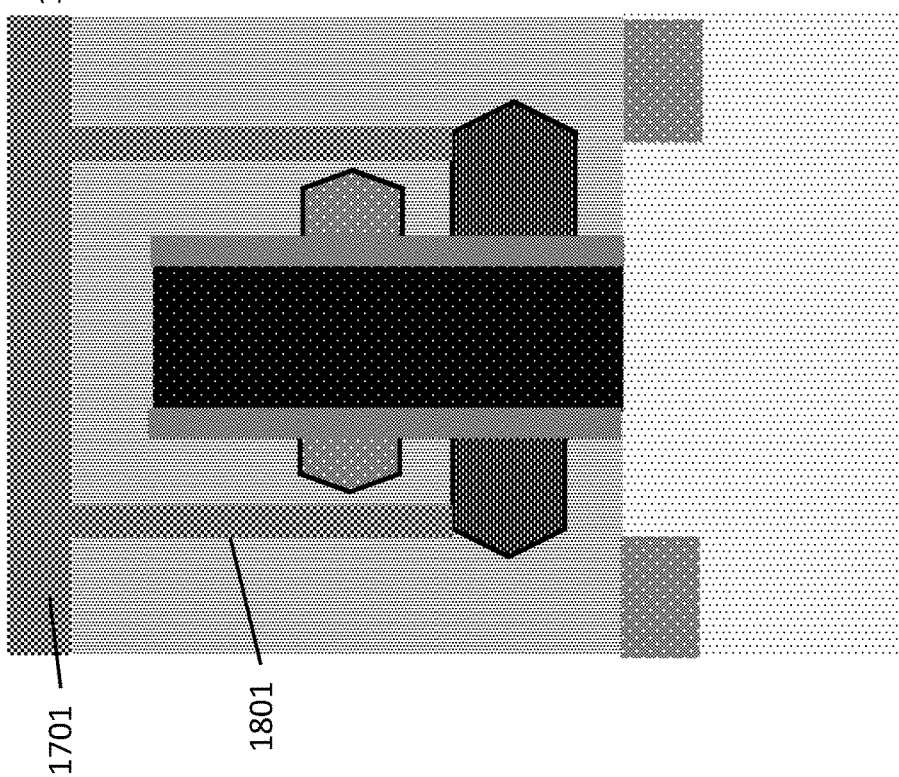

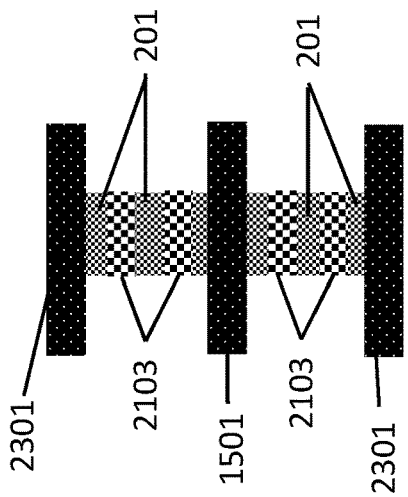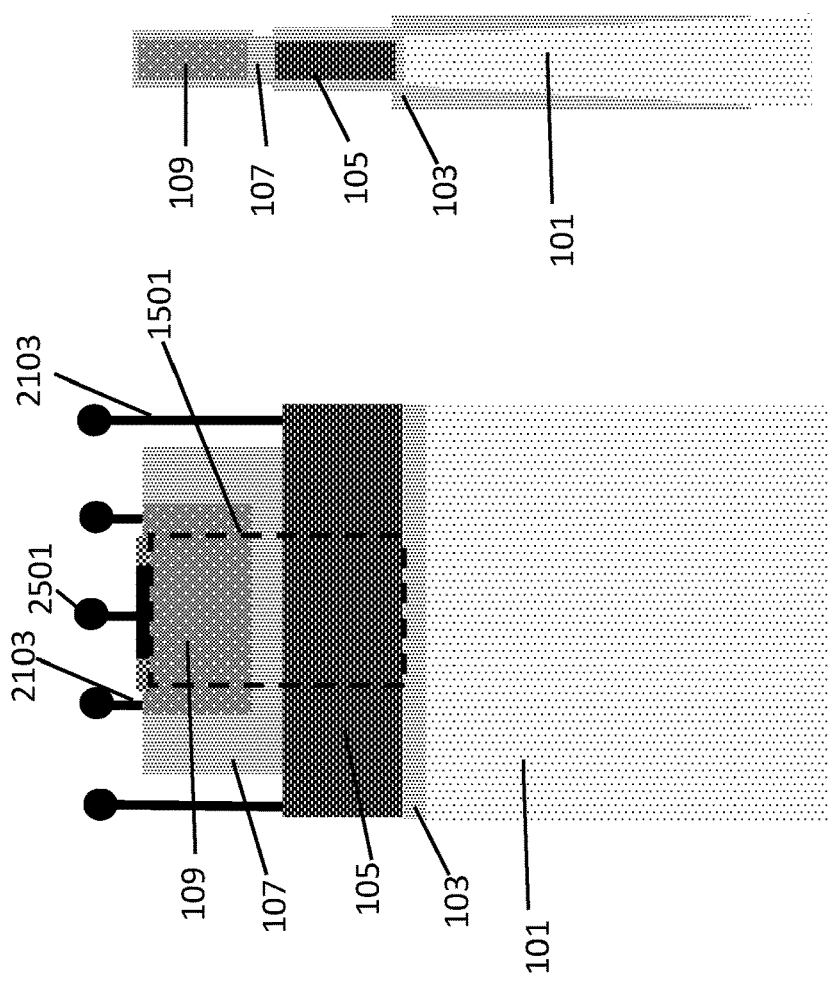

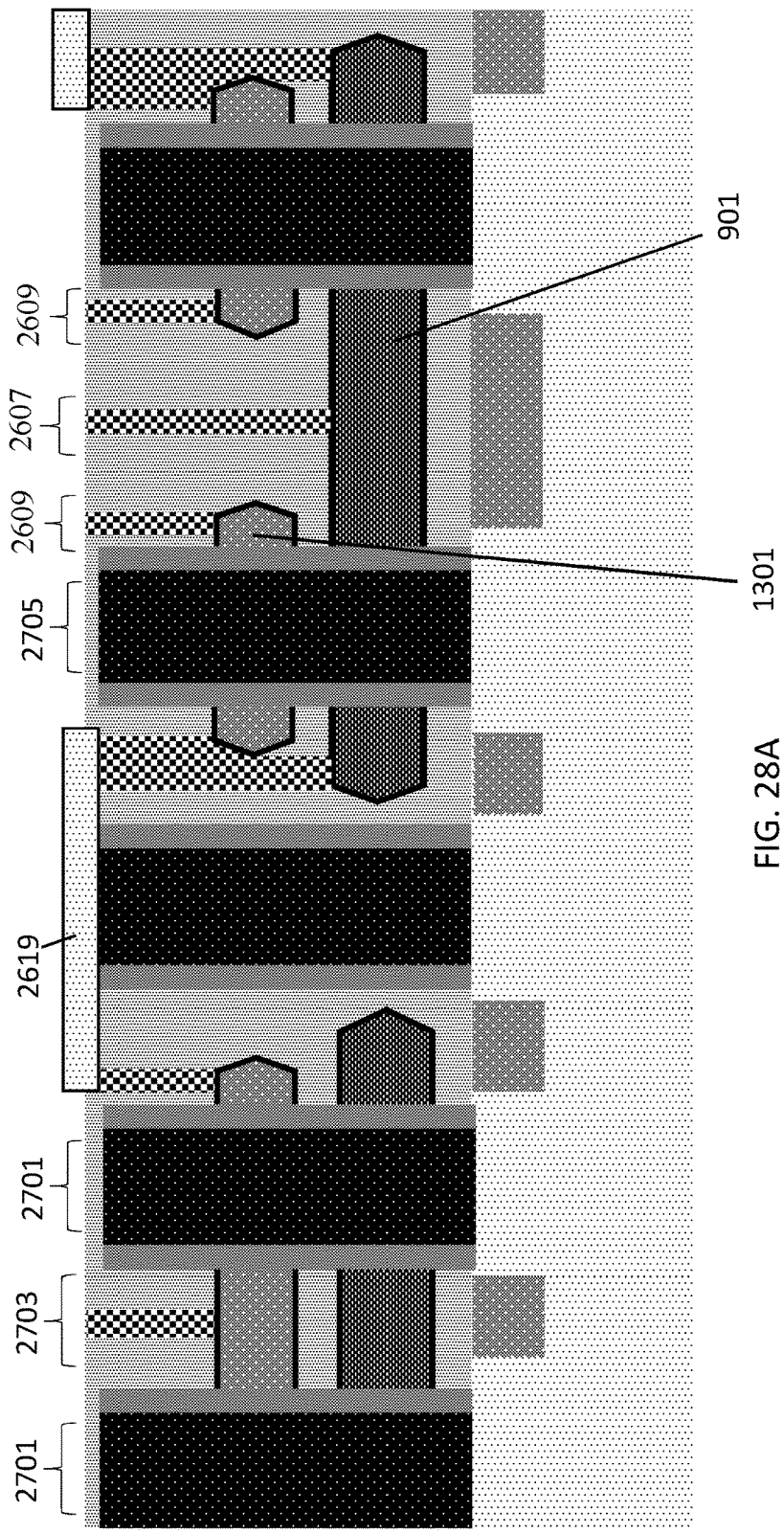

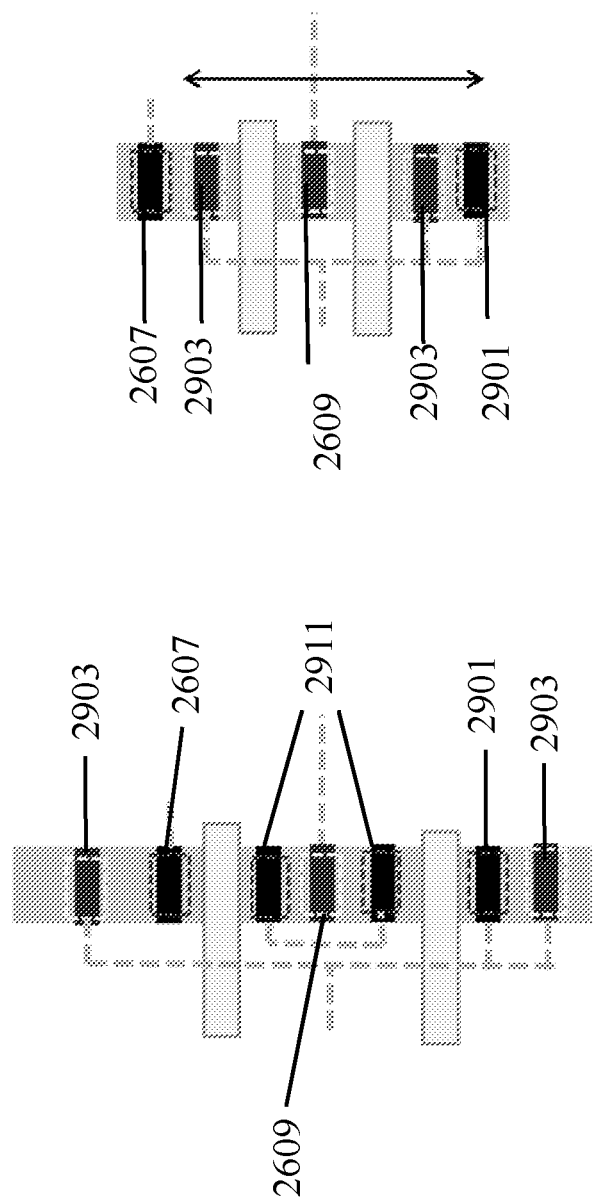

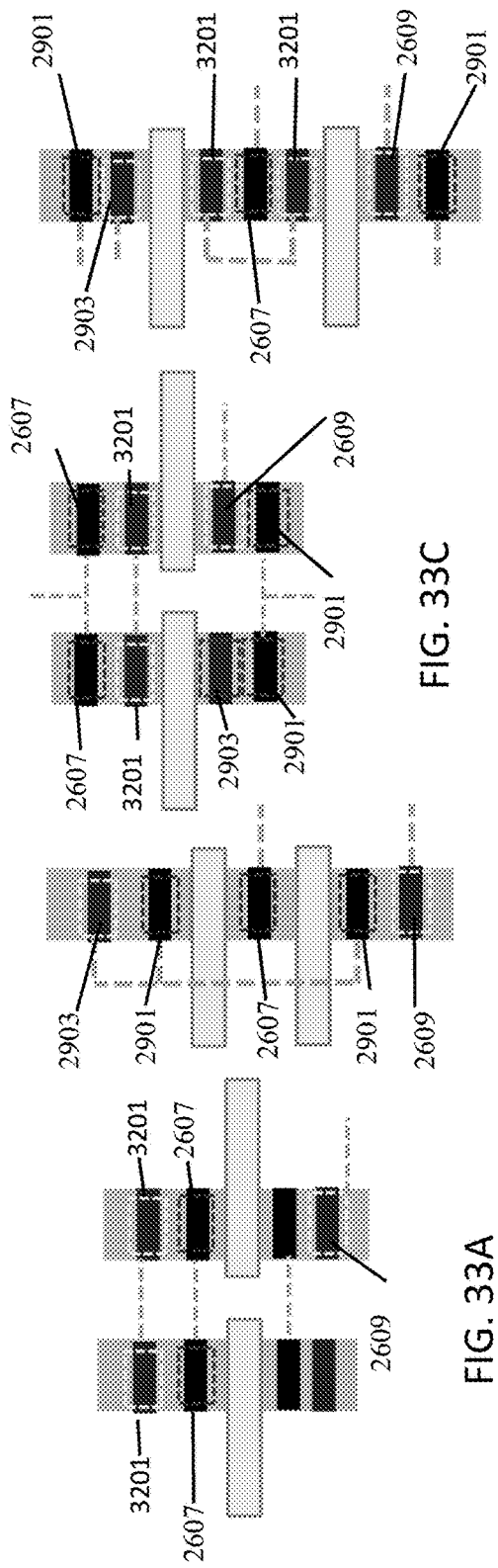

LOGIC LAYOUT WITH REDUCED AREA AND METHOD OF MAKING THE SAME

TECHNICAL FIELD

The present disclosure relates to semiconductor fabrication and to the resulting device. In particular, the present disclosure relates to memory cells using Fin Field Effect Transistors (FinFETs) with a reduced area layout.

BACKGROUND

Static random access memories (SRAMs) include columns and rows of storage cells, each including a circuit with transistors. Existing six-transistor (6T) SRAM architecture has a 12 unit$^2$ of bitcell area, which needs to be further reduced as technology progresses further into the advanced technology nodes. There is a design requirement to form a large number of memory cells on a chip of reasonable size, while at the same time reducing memory cell size and increasing integration density to minimize resistance and capacitance of transistors and connections in order to improve performance. SRAM cell designs can use FinFETs in which the conduction channel is a raised, fin-like structure. This design permits the gate to be placed on two or more sides of the channel to improve conduction and leakage control.

A need therefore exists for methodology enabling the formation of memory structures using FinFETs with reduced bitcell area layout, and a resulting device.

SUMMARY

An aspect of the present disclosure is a process of forming a novel 6T SRAM layout with a smaller bitcell area of 8 unit$^2$. The smaller bitcell area represents a 33% reduction over conventional SRAM layouts which have a 4 fin pitch and 3 gate pitch. Aspects of the present disclosure include a 6T SRAM bitcell having a 2 fin pitch and 3 gate pitch. In certain aspects, the gate is drawn with minimum pitch over an entire array and cut by using another mask layer. With certain aspects, a maximum gate length extends over 2 fins instead of over 3 fins in a conventional 6T SRAM design.

Another aspect of the present disclosure is a process of forming a novel negated or (NOR) gate or negative-and (NAND) gate layout with a reduced bitcell area in a decoder circuit, and the resulting device. Yet another aspect of the present disclosure is a SRAM layout using stacked n-type and p-type FinFETs. In yet another aspect of the present disclosure, the stacked FinFET is comparable to individual FinFETs in terms of simulated voltage rise and fall times.

Another aspect of the present disclosure is to provide the stacked FinFET including a contact extending to a bottom PFET device to serve as power supply pins for adjacent bit cells. In other aspects, an additional two contacts extend to the top NFET device and serve as ground pins for two additional bitcells; and a third contact extends to the top NFET device and serves as a bit line contact for read and write purposes. In yet another aspect, a cross coupling of two inverters is possible with a single contact connecting both the bottom FinFET device and top FinFET device and referred to as an internal storage node. Further aspects include a second level contact used to connect the gate of the inverter and to the internal storage node of another inverter and also connects an access transistor.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first field effect transistor (FET) over a substrate; forming an insulating material over the first FET; forming a second FET over the insulating material; and patterning the first FET, insulating material and second FET to form fins over the substrate for a memory cell.

Aspects of the present disclosure include the first FET being a p-channel FET (PFET) and the second FET is a n-channel FET (NFET), or the first FET is a NFET and the second FET is a PFET. Other aspects include forming an insulating material between the substrate and the PFET; forming shallow trench isolation (STI) regions between the fins; and forming a dummy gate over the fins. Additional aspects include removing the NFET and insulating material from a portion of the fins down the PFET not covered by the dummy gate; and forming a dielectric layer over the substrate and removing a portion of the dielectric layer down to the PFET not covered by the dummy gate. Further aspects include forming a spacer on side surfaces of the dummy gate; removing the dielectric layer; removing the PFET not covered by the dummy gate to form a PFET junction cavity between the insulating material and spacer; and forming silicon germanium (SiGe) in the PFET junction cavity to form p+ source/drain (S/D) regions. Yet further aspects include removing the spacer from the dummy gate; forming a second dielectric over the substrate; removing a portion of the second dielectric layer down to the NFET covered by the dummy gate to form a NFET junction cavity; forming silicon phosphorous (SiP) in the NFET junction cavity to form n+ S/D regions; removing the second dielectric layer; performing silicidation of the p+ S/D regions and n+ S/D regions, wherein a p-channel is formed between the p+ S/D regions under the dummy gate and an n-channel is formed between the n+ S/D regions und the dummy gate. Other aspects include removing the dummy gate; forming a high-k dielectric over the fins; forming a work function metal over the high-k dielectric; and forming a replacement metal gate (RMG) over the work function metal. Other aspects include forming a hardmask (HM) over the substrate and RMG; forming and patterning a photoresist (PR) over the HM; etching through the HM to form contact vias down to the p+ S/D regions and/or the n+ S/D regions; and filling the contact vias with the PR. Additional aspects include removing the PR; and filling the contact vias for the n+ and/or p+ S/D regions with a metal. Further aspects include the p+ S/D regions extending to adjacent RMGs. Other aspects include both the p+ S/D regions and n+ S/D regions extending to adjacent RMGs and the metal filled contact vias contact the n+S/D regions.

In yet another aspect of the present disclosure, there is provided silicon (Si) fins formed over a substrate; and a metal gate formed over the Si fins; wherein the Si fins include a first FET stacked over a second FET, and wherein the first FET is a PFET and the second FET is a NFET, or the first FET is a NFET and the second FET is a PFET.

Aspects include the STI regions being formed over the substrate between the fins. Additional aspects include S/D regions formed for the first FET; and S/D regions formed for the second FET. Further aspects include contacts being formed over the S/D regions for the first and/or second FET. Yet further aspects include an insulating material formed between the substrate and the first FET; and an insulating material formed between the first FET and second FET. Additional aspects include the metal gate being a RMG.

Yet another aspect of the present disclosure includes a method including forming a first FET over a substrate; forming an insulating material over the first FET; forming a second FET over the insulating material; patterning the first FET, insulating material and second FET to form fins over the substrate; forming STI regions between the fins; forming a metal gate over the fins; forming S/D regions for the first and second FETs, wherein the first FET is a PFET and the second FET is a NFET, or the first FET is a NFET and the second FET is a PFET.

Aspects include forming contacts over the S/D regions for the first FET and/or second FET. Other aspects include forming a high-k dielectric and work function metal over the fins under the metal gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 22A schematically illustrate cross-sectional views along a fin length of fabrication process steps for producing a stacked FinFET device, in accordance with an exemplary embodiment;

FIGS. 1B through 22B schematically illustrate cross-sectional views along a fin width of fabrication process steps for producing a stacked FinFET device, in accordance with an exemplary embodiment;

FIGS. 25A, 25B, and 25C illustrate front, side, and top views, respectively, of a stacked FinFET device, in accordance with an exemplary embodiment;

FIG. 28A illustrates a cross-sectional view of a stacked FinFET device with contact scheme, in accordance with an exemplary embodiment;

FIGS. 29B and 29C illustrate top views of a stacked FinFET device with NOR logic gate, in accordance with other exemplary embodiments;

FIGS. 33A, 33B, 33C, and 33D illustrate top views of a stacked FinFET device with NAND logic gate, in accordance with other exemplary embodiments.

DETAILED DESCRIPTION

Figure 4B:
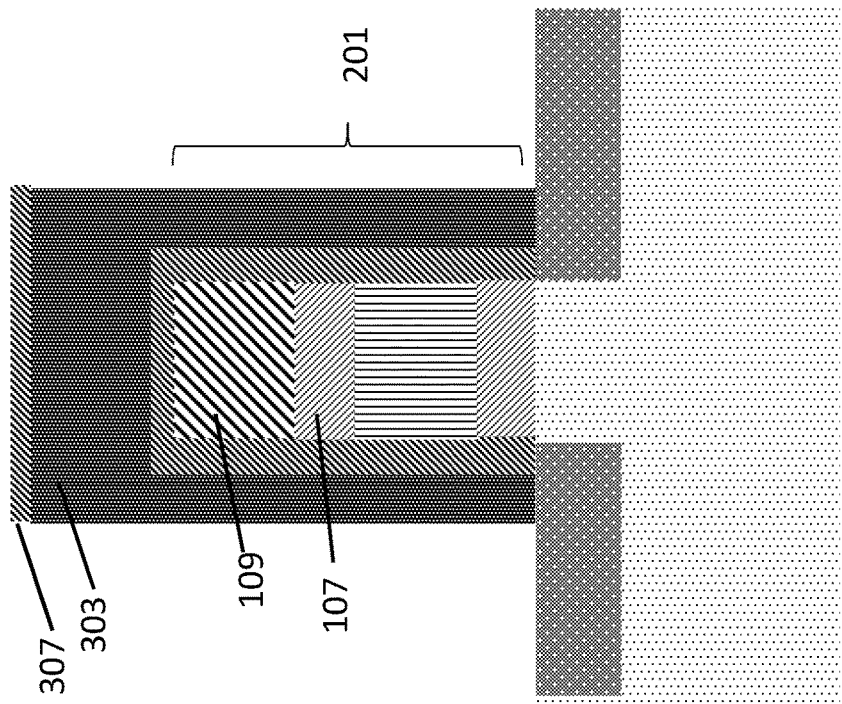

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of large area layouts for memory devices. In accordance with embodiments of the present disclosure, the present disclosure addresses and solves the current problem of large area layouts using stacked n-type and p-type Fin-FETs to reduce area layouts.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 24A and FIGS. 1B through 24B schematically illustrate cross-sectional views of fabrication process steps for producing a stacked FinFET device, in accordance with an exemplary embodiment. In particular, FIGS. 1A-24A are cross-sectional views along a fin length; and FIGS. 1B-24B are cross-sectional views along a fin width.

In FIGS. 1A and 1B, a substrate 101 such as a Si bulk substrate 101 is provided. Examples of materials that may be suitable for use in the substrate 101 include silicon-on-insulator (SOI), SiGe, germanium, and/or compound semiconductor materials. A sacrificial SiGe layer 103 is deposited over the substrate 101. As an example, an epitaxy deposition process, including chemical vapor deposition (CVD), is used to form the sacrificial SiGe layer 103 over the substrate 101. A p-type FinFET 105 formed over the sacrificial SiGe layer 103. The p-type FinFET 105 is formed of Si, and impurities such as boron (B), aluminum (Al), or gallium (Ga) are doped into the Si to form the p-type FinFET 105. A second sacrificial SiGe layer 107 is deposited over the p-type FinFET 105. An n-type FinFET 109 is formed over the second sacrificial SiGe layer 107. The n-type FinFET 109 is formed of Si, and impurities such as phosphorous (P) or arsenic (As) are doped into the Si to form the n-type FinFET 109. In other examples, the p-type FinFET 105 is stacked on top of the n-type FinFET 109 depending on the specific device layout.

In FIGS. 2A and 2B, a patterning step is performed to form one or more fins 201 over the substrate 101. STI regions 203 are formed to define each fin 201. In this example, only a single fin 201 is shown for illustrative convenience. The STI regions 203 prevent electric current leakage between adjacent semiconductor device components. STI regions 203 are formed before transistors are formed. The STI process involves etching a pattern of trenches in the silicon substrate 101, and depositing one or more dielectric materials, such as silicon dioxide ($SiO_2$), to fill the trenches, and removing the excess dielectric using a technique such as chemical-mechanical planarization (CMP).

Referring to FIGS. 3A and 3B, an insulating layer 301 is formed over each fin 201 prior to the formation of a dummy gate. The dummy gate 303 is formed over the insulating layer 301 over each fin 201 and then spacers 305 are formed on sidewalls of the dummy gate 303. The dummy gate 303 is formed, for example, of an amorphous silicon or polysilicon. Another insulating layer 307 is formed on top of the dummy gate 303.

Figure 4A:
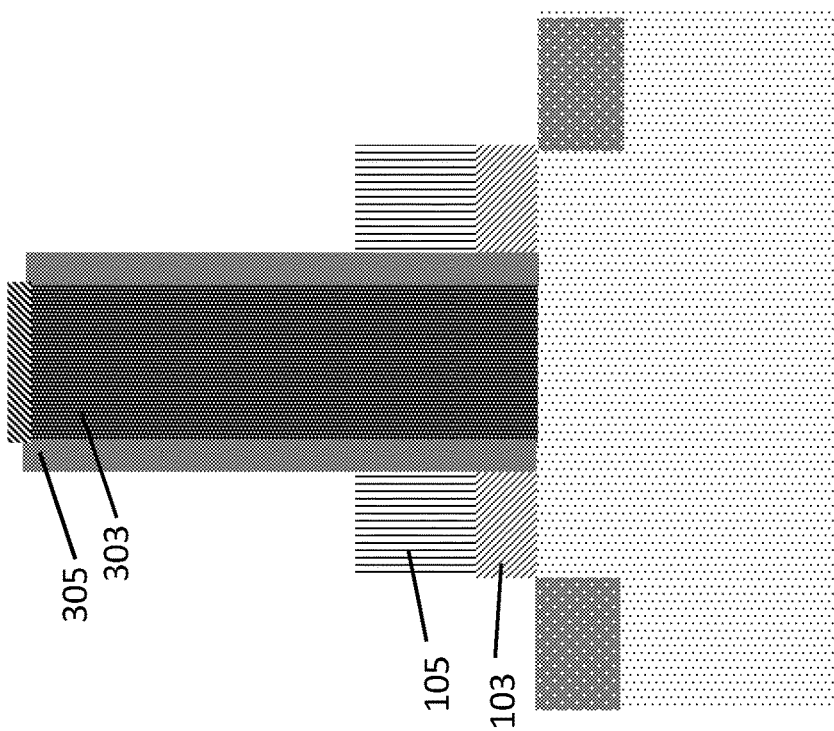
Figure 5B:
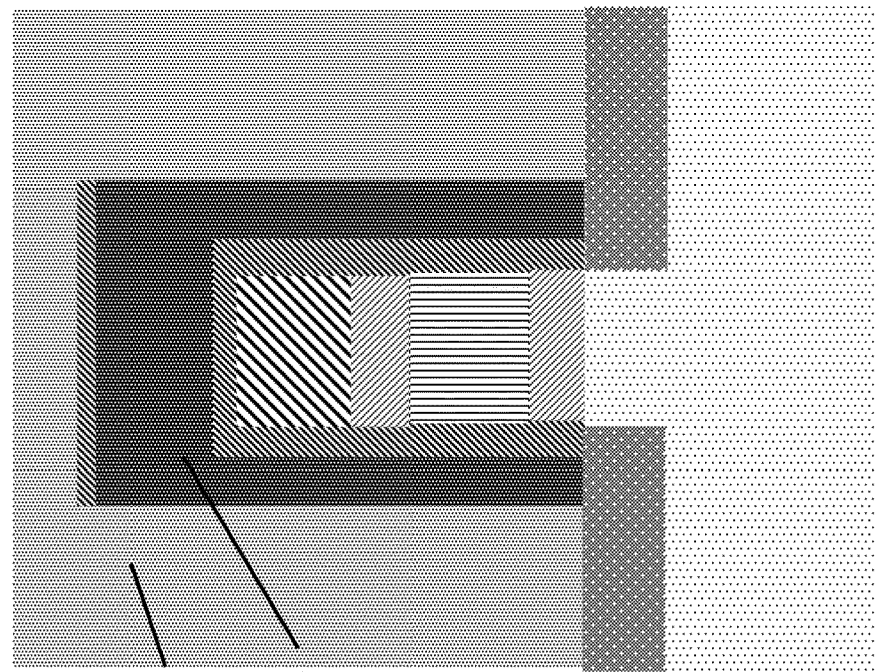
Figure 5A:
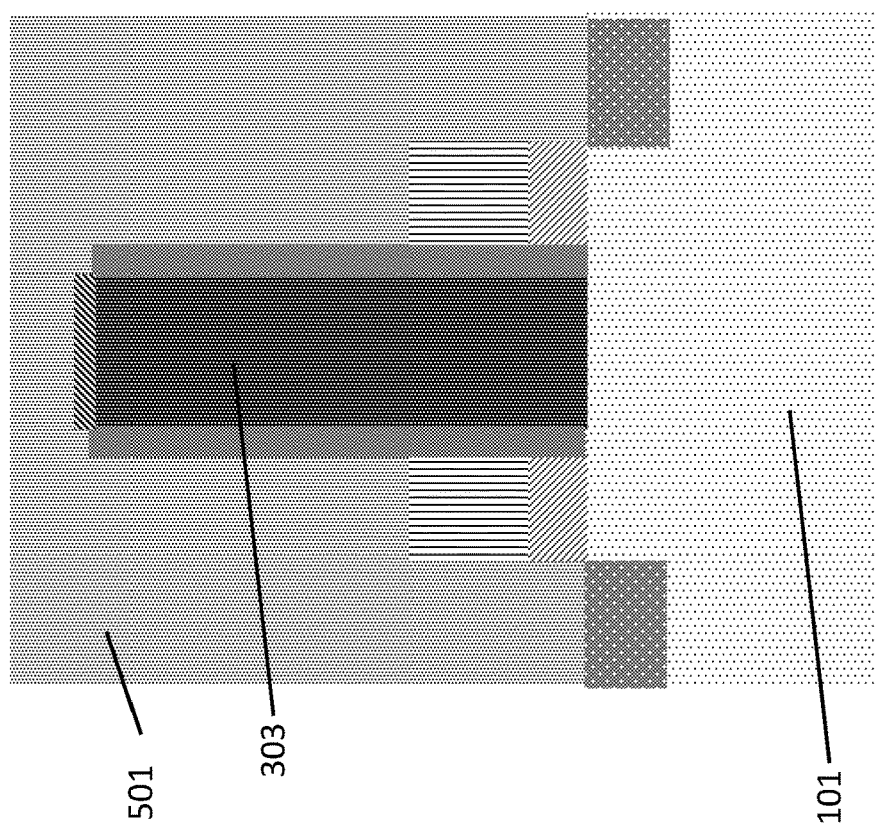

In FIGS. 4A and 4B, a cavity etching step is performed to form an NFET channel junction under the dummy gate for NFET S/D regions. The cavity etch removes the exposed portions (FIG. 4A) of the n-type FinFET 109 and second sacrificial SiGe layer 107 that are not under the dummy gate 303. In FIGS. 5A and 5B, a dielectric layer 501 is deposited over the substrate 101 and dummy gate 303 and excess dielectric layer 501 is removed by planarization, such as CMP. The dielectric layer 501 can be formed of a silicon oxide (SiO) or silicon nitride (SiN).

Figure 7A:
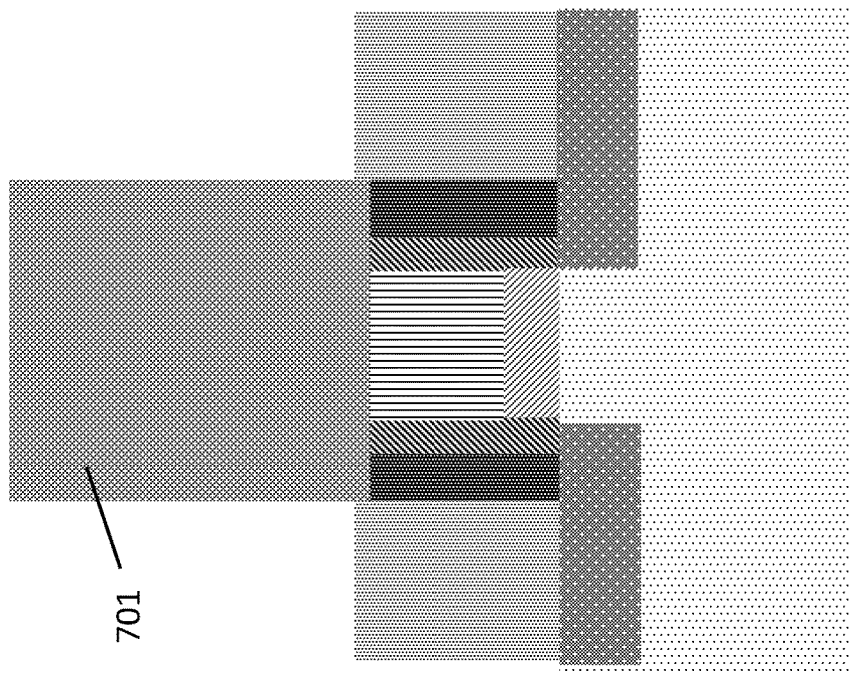
Figure 7B:
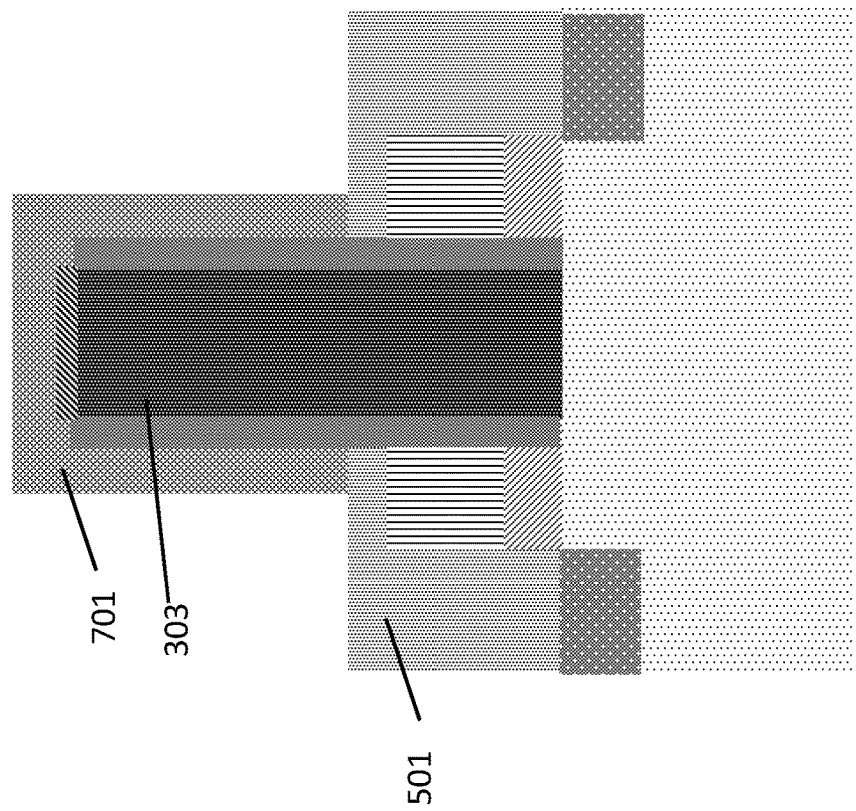
Figure 8A:
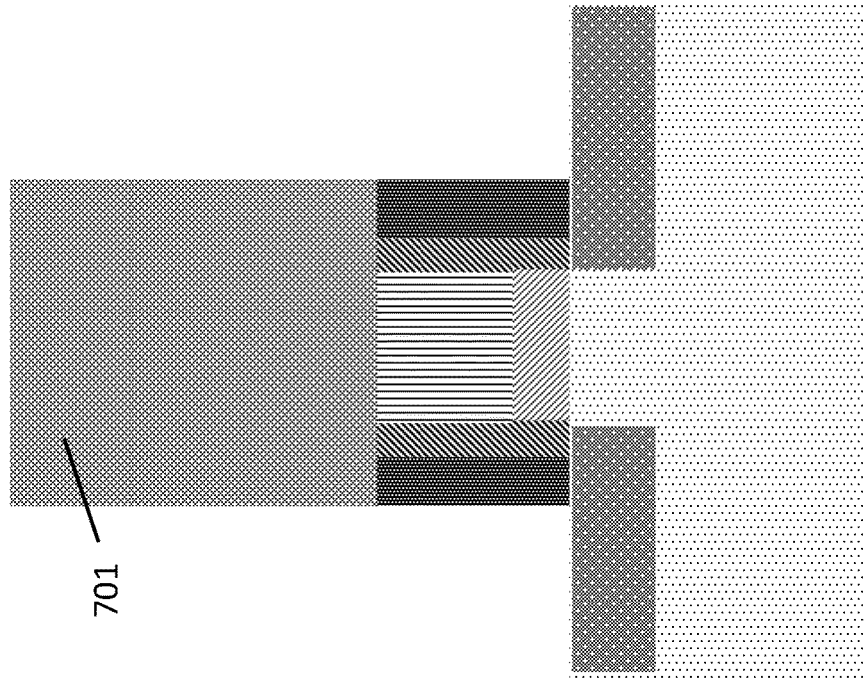
Figure 8B:
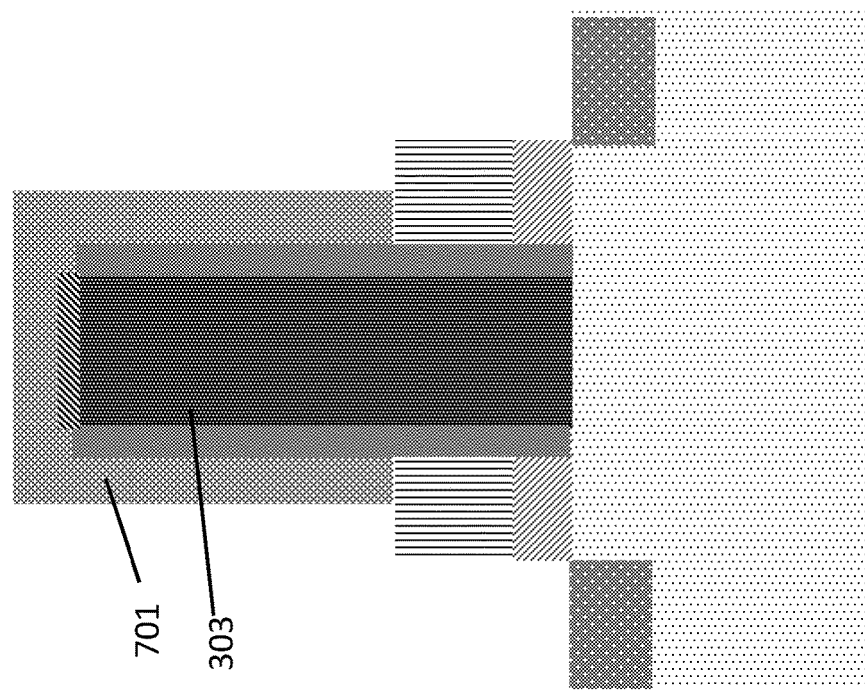

As shown in FIGS. 6A and 6B, the dielectric layer 501 is etched back to just above the p-type FinFET 105. In FIGS. 7A and 7B, a p-type dielectric spacer 701 is deposited over the dummy gate 303. In FIGS. 8A and 8B, the remaining dielectric layer 501 is removed with an etch planarization step.

Figure 10B:
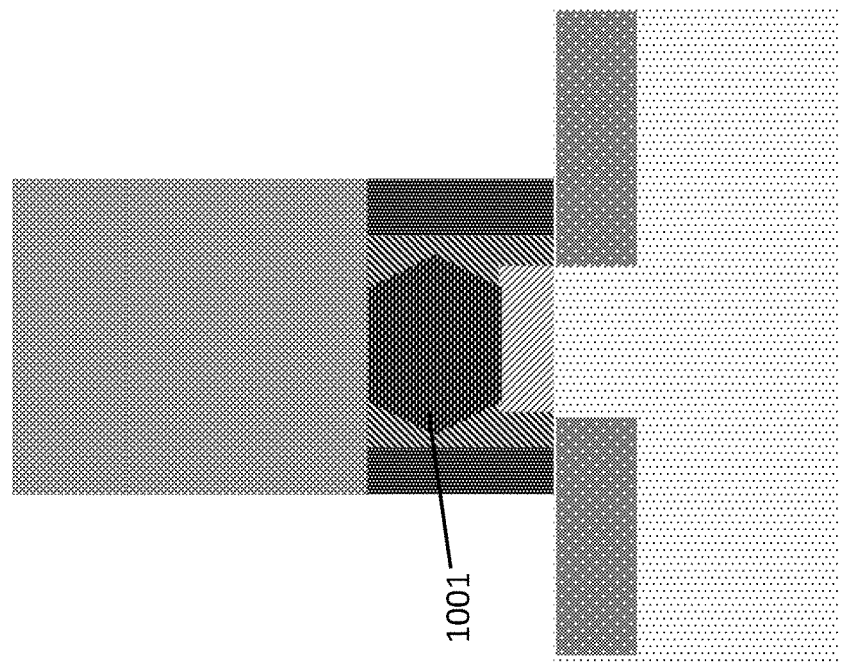
Figure 10A:
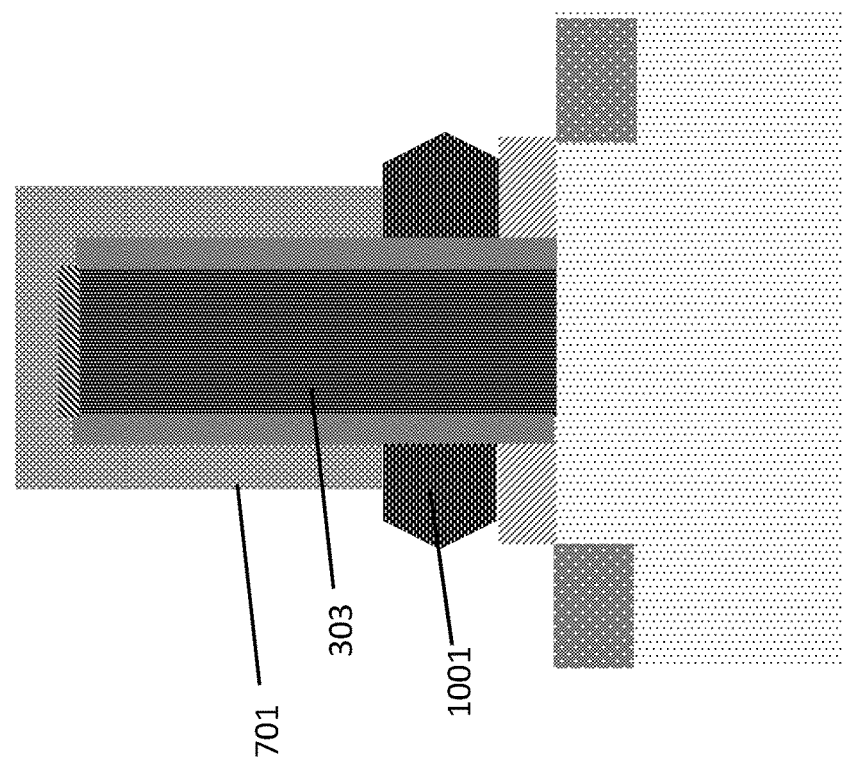

Referring to FIGS. 9A and 9B, a cavity etching step is performed to remove a portion of the p-type dielectric spacer 701 to form an PFET channel junction 901 (FIG. 9A) under the dummy gate 303. The cavity etch can be a dry etch, wet etch or a combination of wet and dry etch. In FIGS. 10A and 10B, a PFET epitaxy process is performed to grow a PFET S/D region 1001 on ends of each fin 201. The PFET S/D region 1001 can be formed of SiGe and doped with p-type impurities.

Figures 12A, 12B:
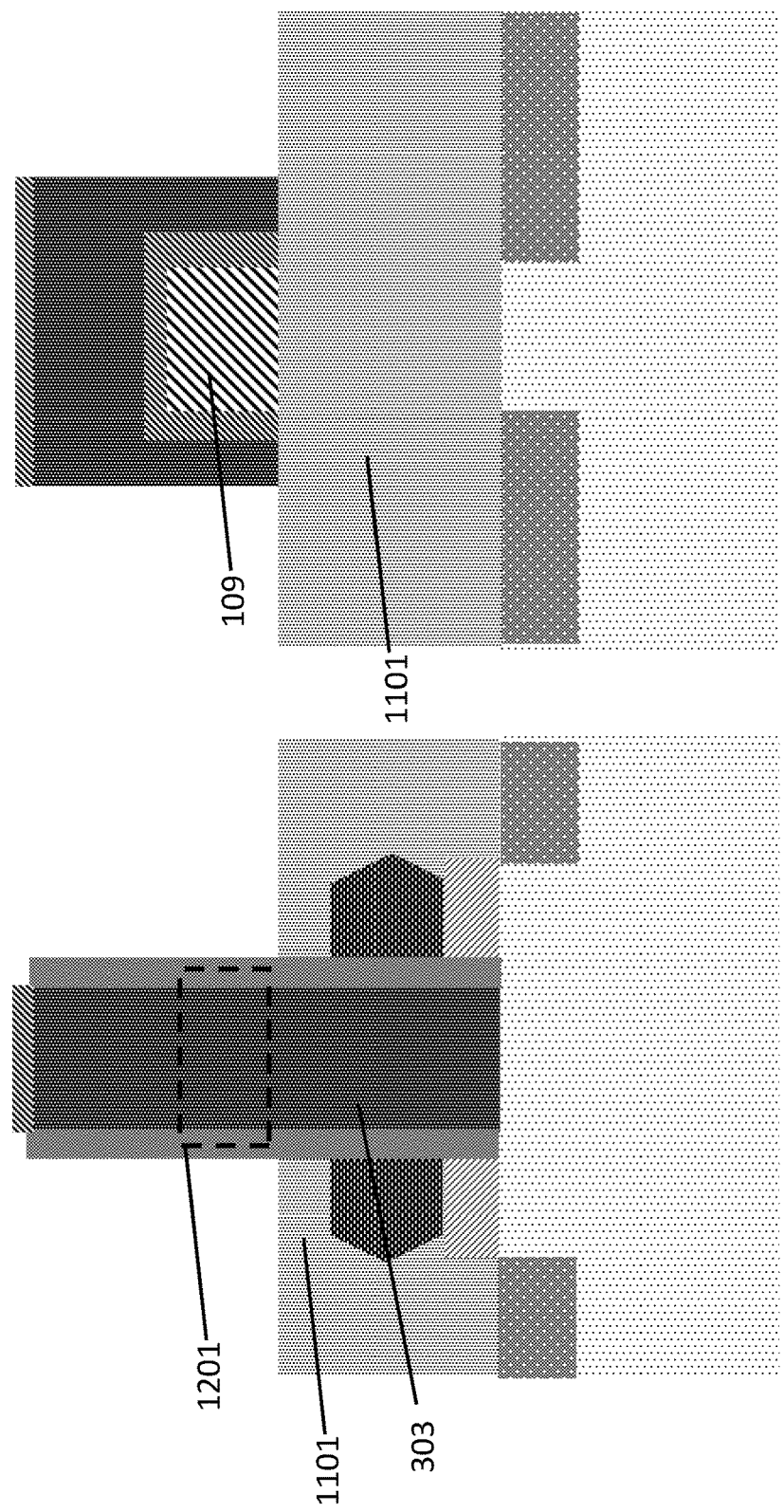
Figure 13B:
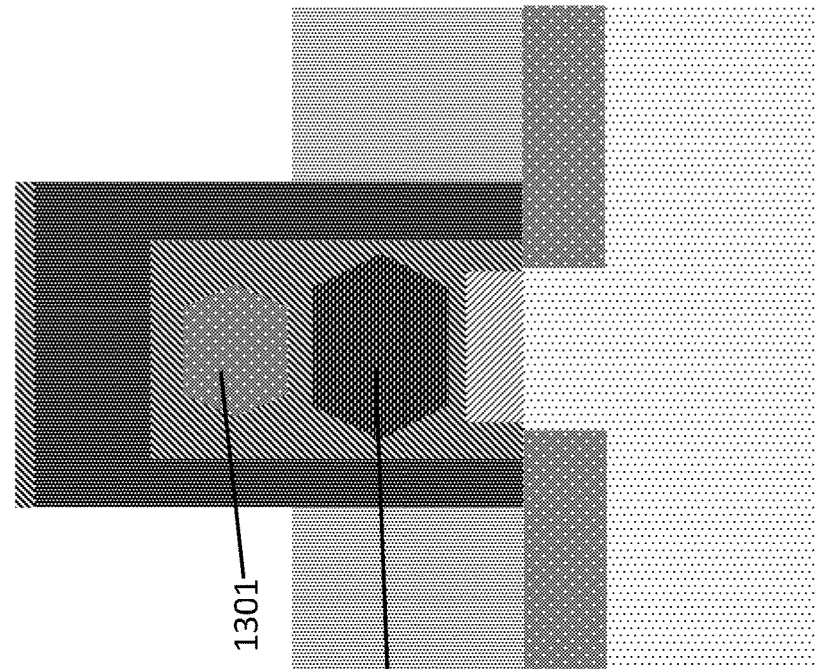
Figure 13A:
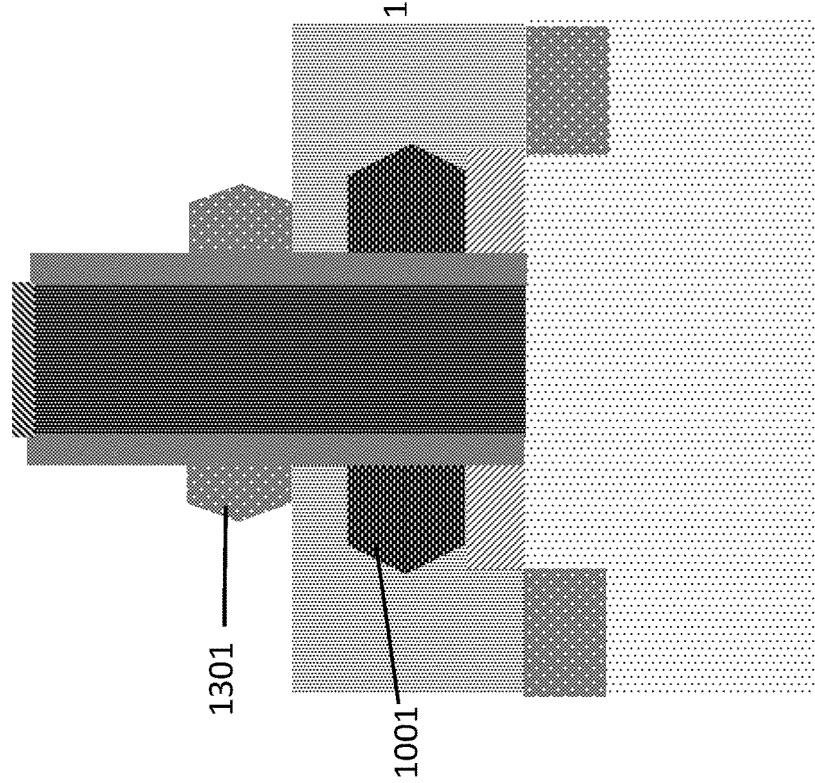

As shown in FIGS. 11A and 11B, the p-type dielectric spacer 701 is removed prior to the deposition of a planarization dielectric 1101 over the dummy gate 301 and substrate 101. In FIGS. 12A and 12B, an etch back step is performed to remove a portion of the planarization dielectric 1101 to expose the NFET channel junction 1201 under the dummy gate 303 for NFET S/D regions. In FIGS. 13A and 13B, an epitaxy deposition process is performed to form the NFET S/D regions 1301. In this example, the NFET S/D regions 1301 are formed over the PFET S/D regions 1001, but in other embodiments, the PFET S/D regions 1001 are formed over the NFET S/D regions 1301. The NFET S/D regions 1301 can be formed of an epitaxially grown SiP.

In FIGS. 14A and 14B, the planarization dielectric layer 1101 is removed by a planarization step. The n-type drain of the NFET S/D regions 1301 is on one side of the dummy gate 303 and a n-type source is formed on the other side of the dummy gate 303 (FIG. 14A). The p-type drain of the PFET S/D regions 901 is on one side of the dummy gate 303 and a p-type source is formed on the other side of the dummy gate 303 (FIG. 14A).

In FIGS. 15A and 15B, the dummy gate is removed by an RMG process to form a RMG 1501 between spacers 305. First, each fin 201 is released by a selective SiGe etch and the dummy gate 303 is removed. A high-k dielectric layer 1503 is deposited over each fin 201 and a work function metal 1505 is formed over the high-k dielectric layer 1503. The RMG 1501 is then deposited. A silicidation process of PFET S/D regions 901 and NFET S/D regions 1301 to form silicide layer 1507 is necessary to minimize the impact of junction parasitic resistance.

As shown in FIGS. 16A and 16B, additional middle of line (MOL) processing of the device utilizing a patterning process, such as litho-etch-litho-etch (LELE) which is a double patterning process, is performed. A hardmask 1601 is deposited over the RMG 1501 and substrate 101 to allow for the formation of contact vias by a patterning process described below.

Figure 17B:
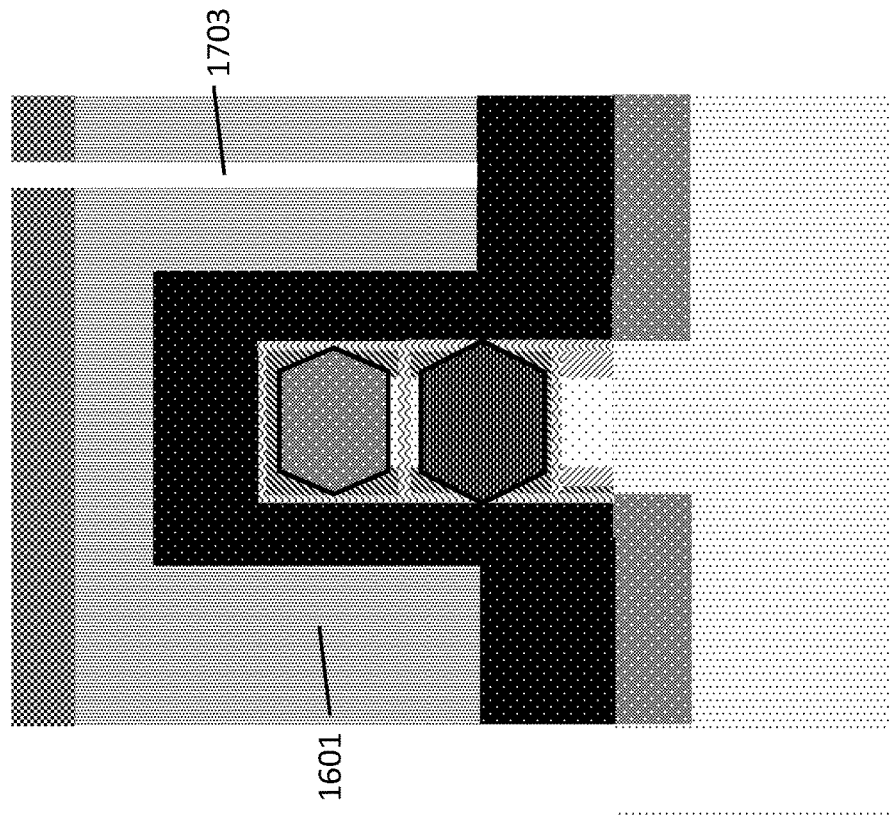
Figure 17A:
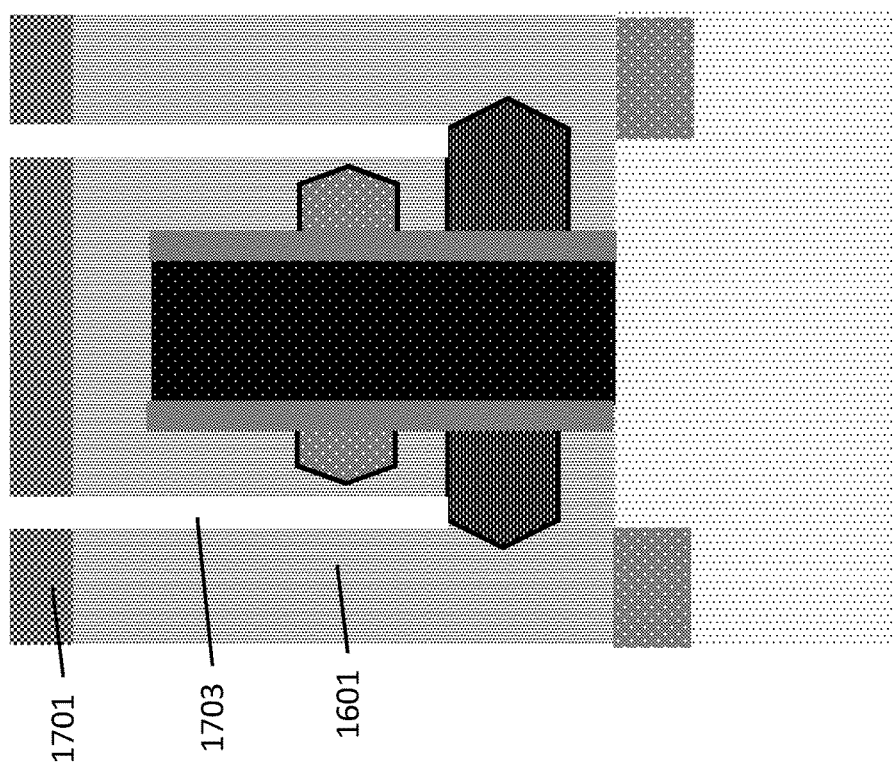
Figure 19B:
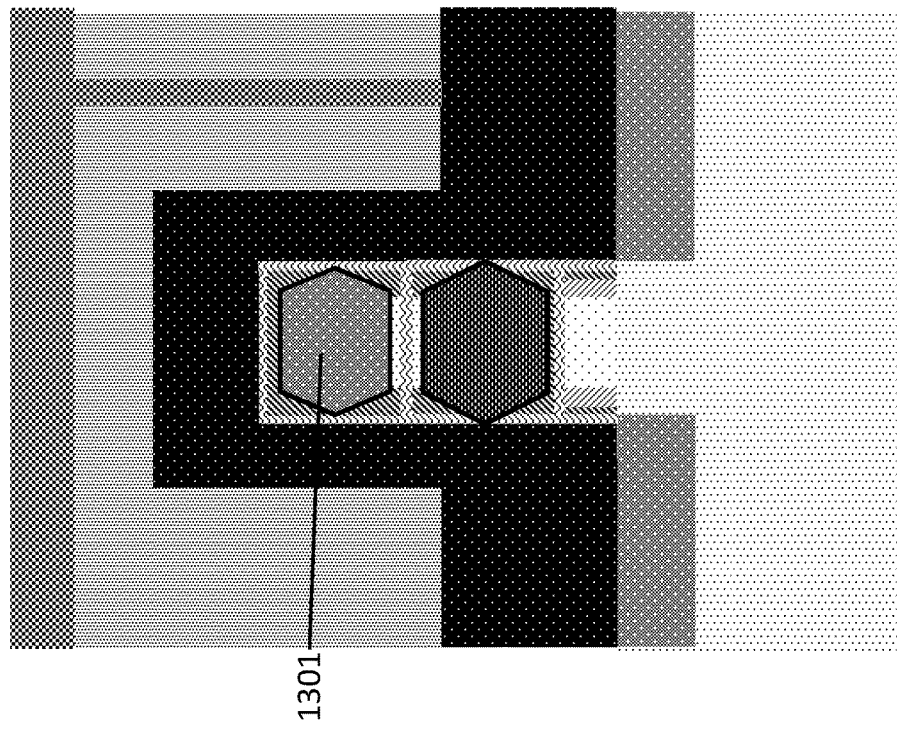
Figure 19A:
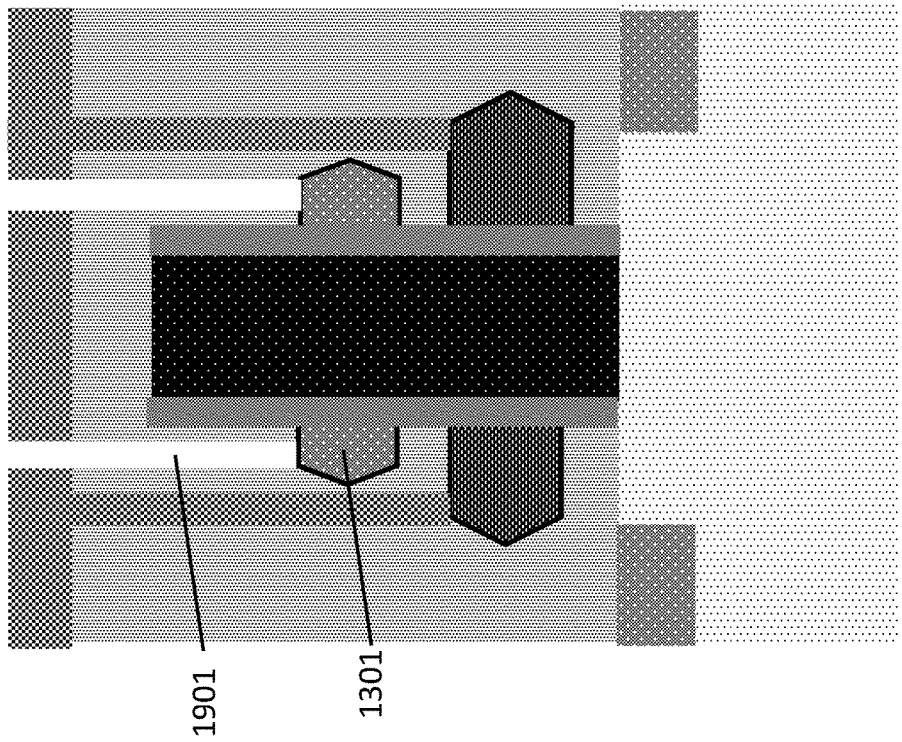

Referring to FIGS. 17A and 17B, a first photoresist (PR) coating 1701 is deposited over the hardmask 1601 and patterned to form vias 1703 extending down to the p-type S/D regions 901. As shown in FIGS. 18A and 18B, a second PR coating 1801 fills the vias 1703. In FIGS. 19A and 19B, the second PR coating 1801 is patterned to form vias 1901 extending down to n-type S/D regions 1301.

Figure 20B:
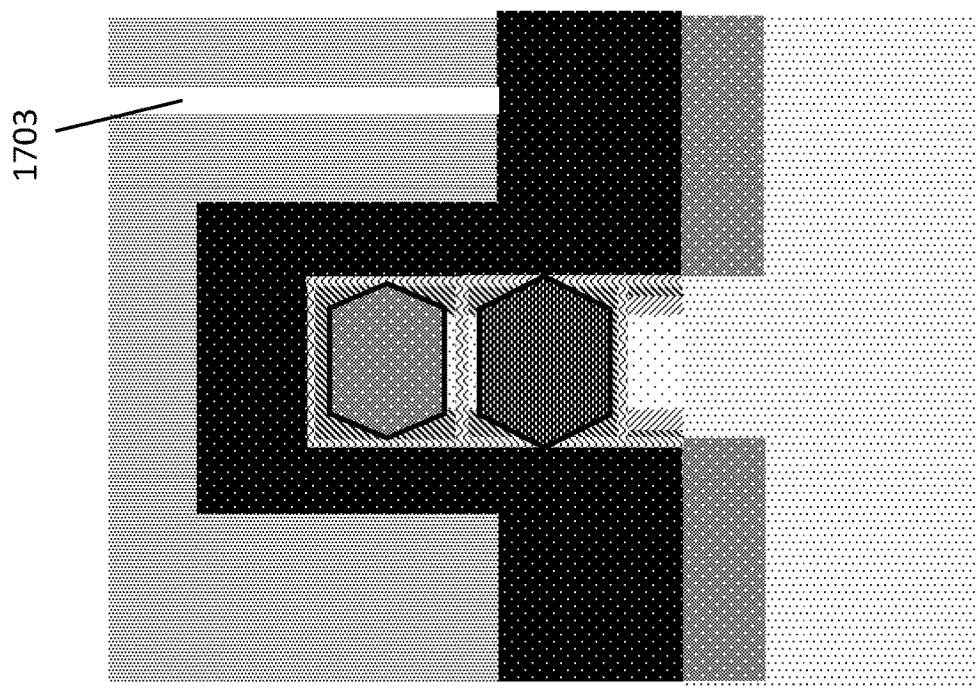
Figure 20A:
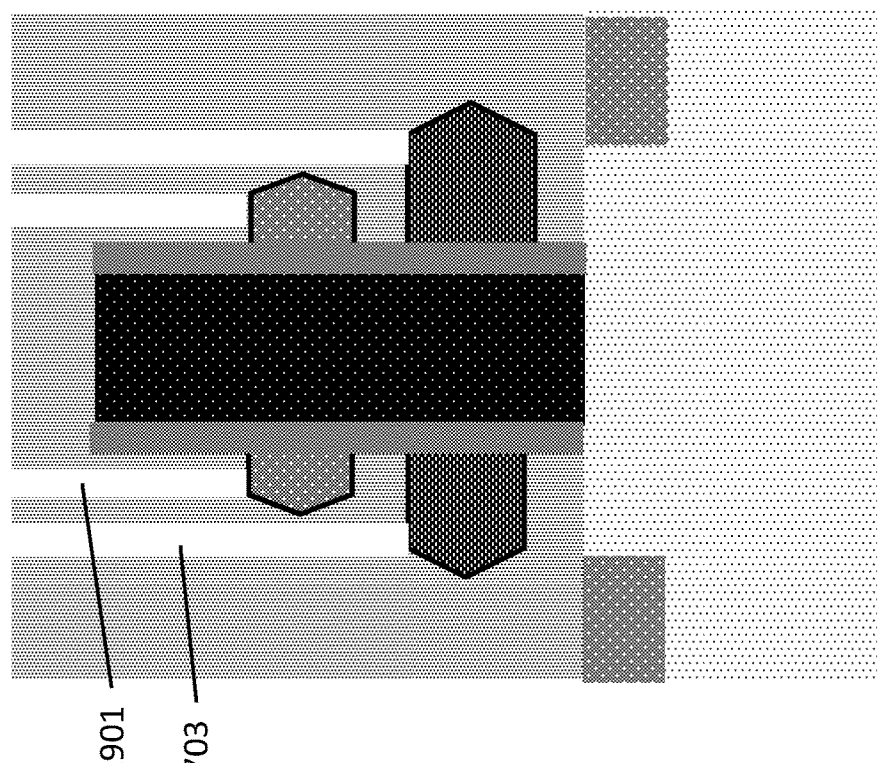
Figure 21B:
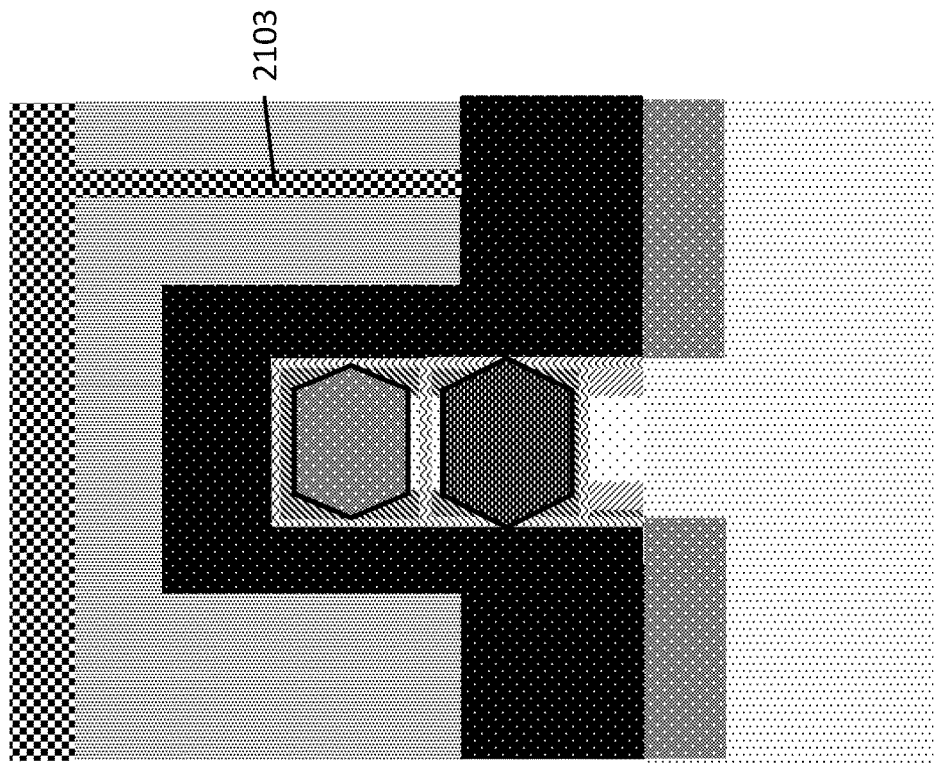
Figure 21A:
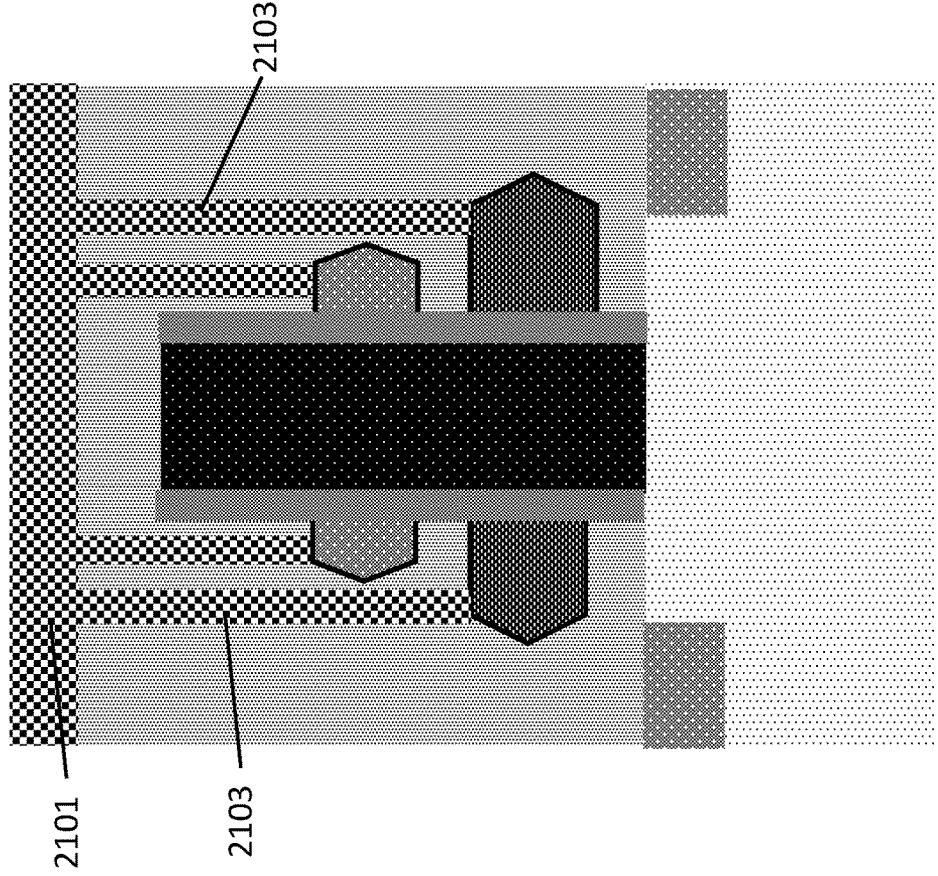
Figure 22B:
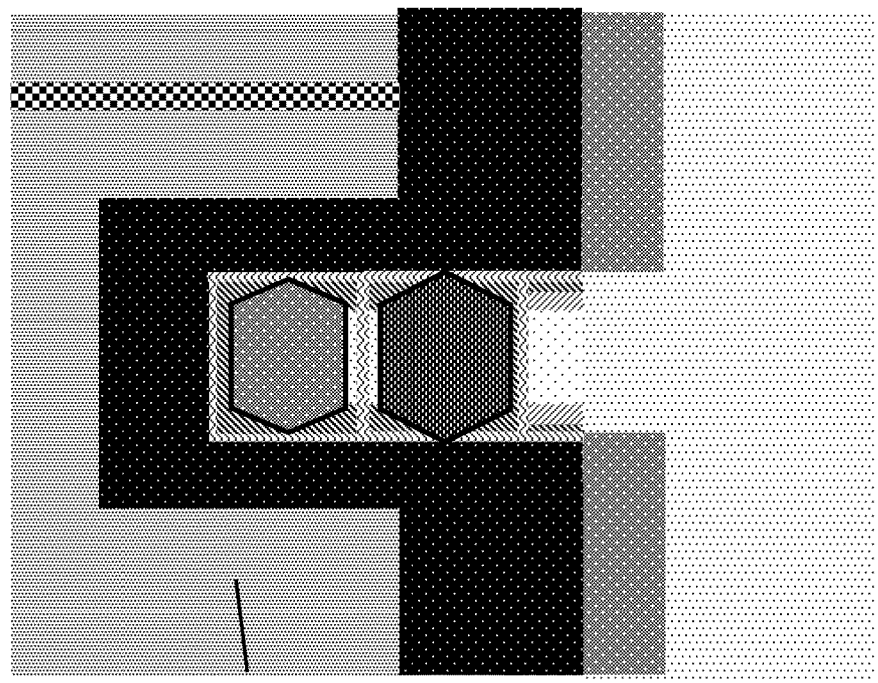
Figure 22A:
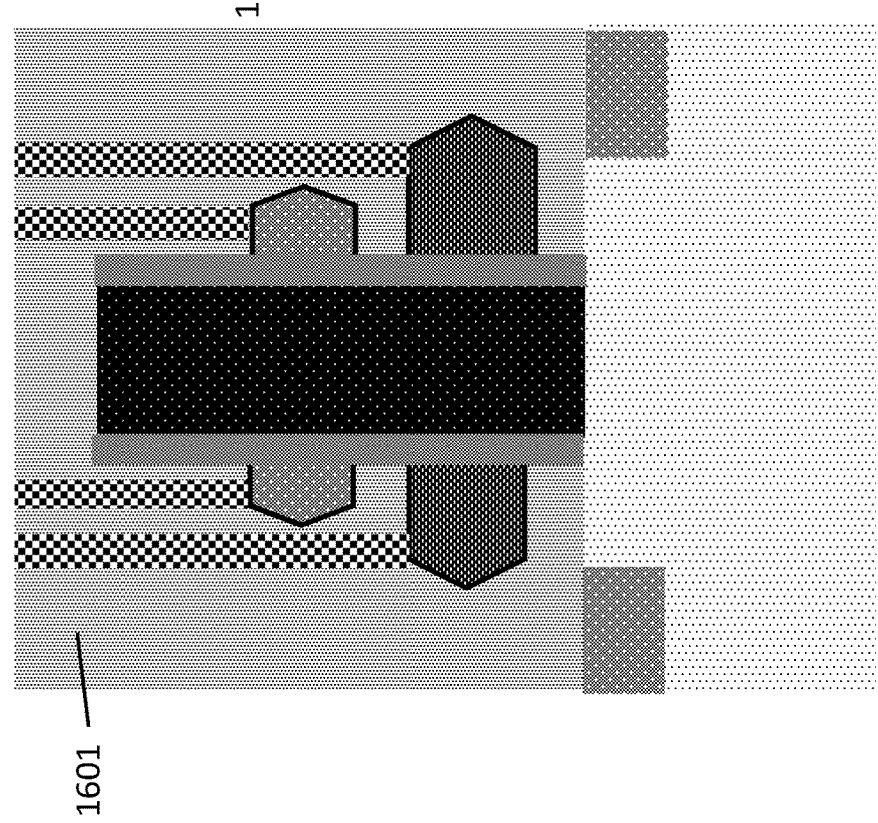

In FIGS. 20A and 20B, the remaining first PR 1701 and second PR 1801 are stripped with an etching process to expose vias 1703 and 1901. In FIGS. 21A and 21B, the vias 1703 and 1901 are filled with a metal 2101 by way of a sputtering or vapor deposition process to form metal filled S/D contacts 2103. In FIGS. 22A and 22B, the metal 2101 is planarized down to the top surface of the hardmask 1601.

Figure 23:
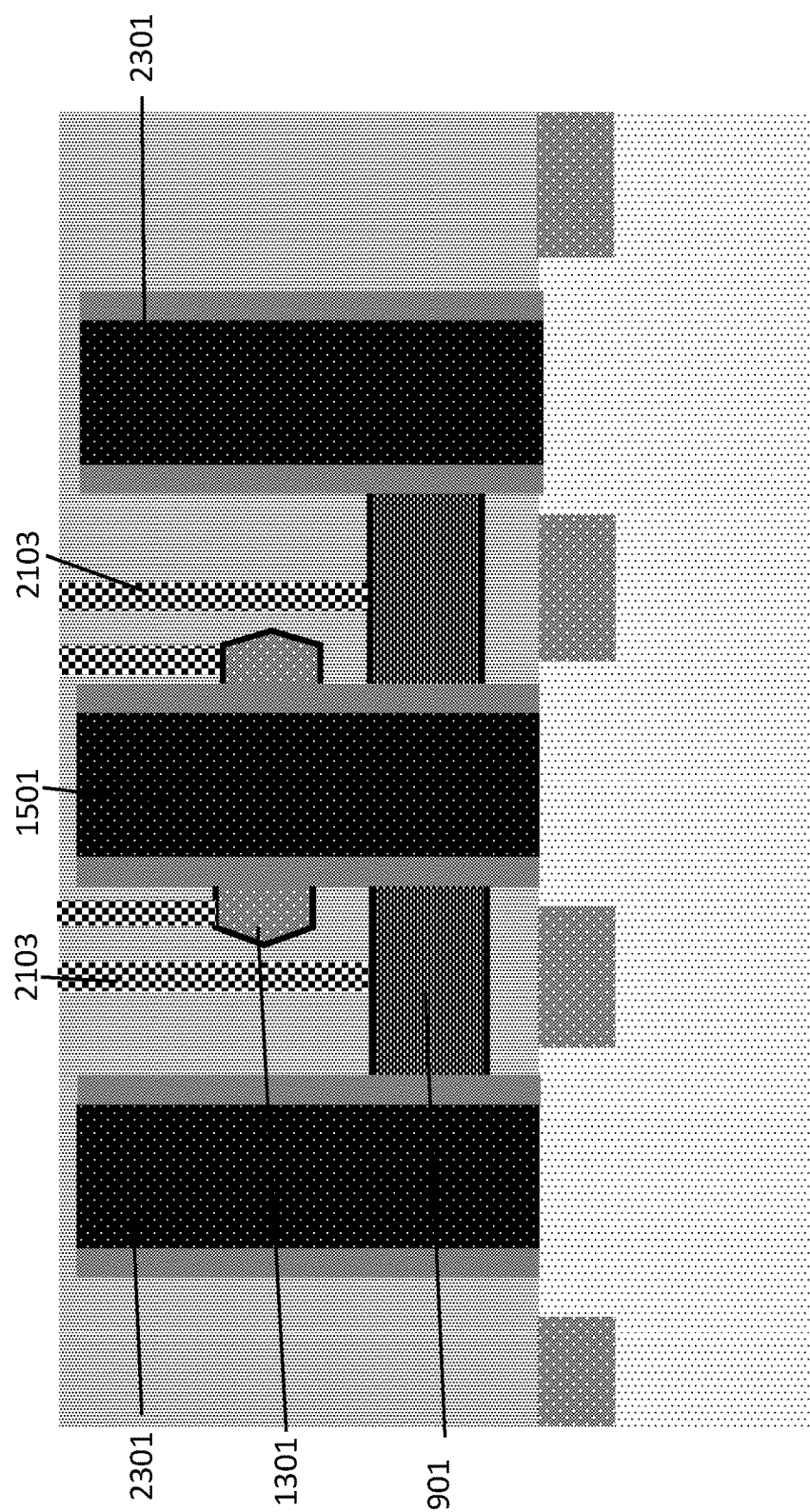
FIGS. 23 and 24 illustrate cross-sectional views along a fin length of a stacked FinFET device in conjunction with auxiliary gates, in accordance with another exemplary embodiment.

Referring to FIG. 23, an additional embodiment is shown with auxiliary gates 2301 disposed on sides of the RMG 1501. The auxiliary gates 2301 share p-type S/D regions 901 with RMG 1501.

Figure 24:
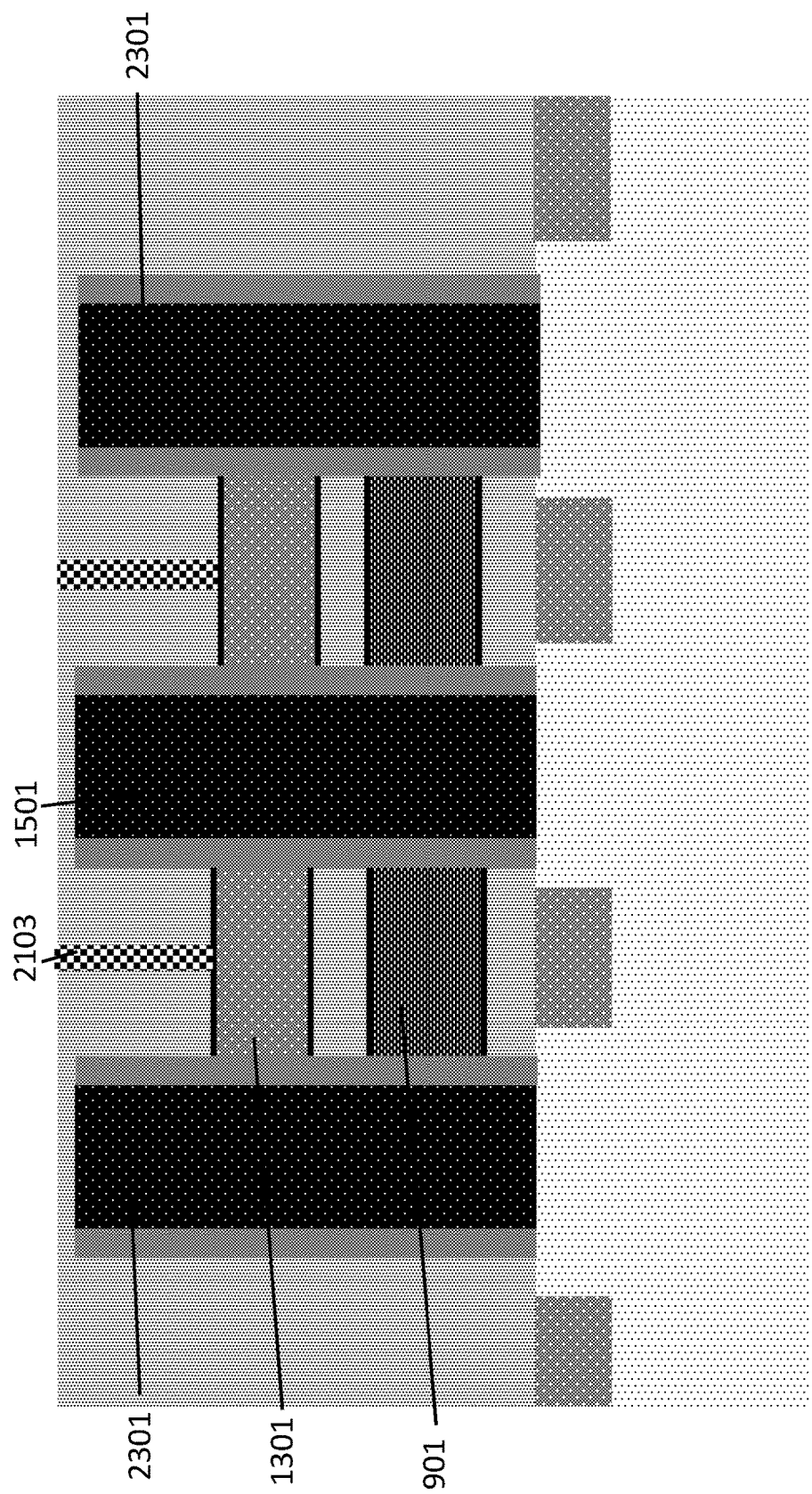

Referring to FIG. 24, an additional embodiment is shown with auxiliary gates 2301 disposed on sides of the RMG 1501. The auxiliary gates 2301 share p-type S/D regions 901 and n-type S/D regions 1301.

FIGS. 25A, 25B, and 25C illustrate front, side, and top views, respectively, of a stacked FinFET device, in accordance with an exemplary embodiment. Like reference numerals refer to similar elements mentioned above for FIGS. 1A-22B. A gate contact 2501 (FIG. 25A) is further shown in this example. In the top view of FIG. 25C, auxiliary gates 2301 are illustrated on sides of the RMG 1501. Metal filled S/D contacts 2103 are shown over fin 201.

Figure 26A:
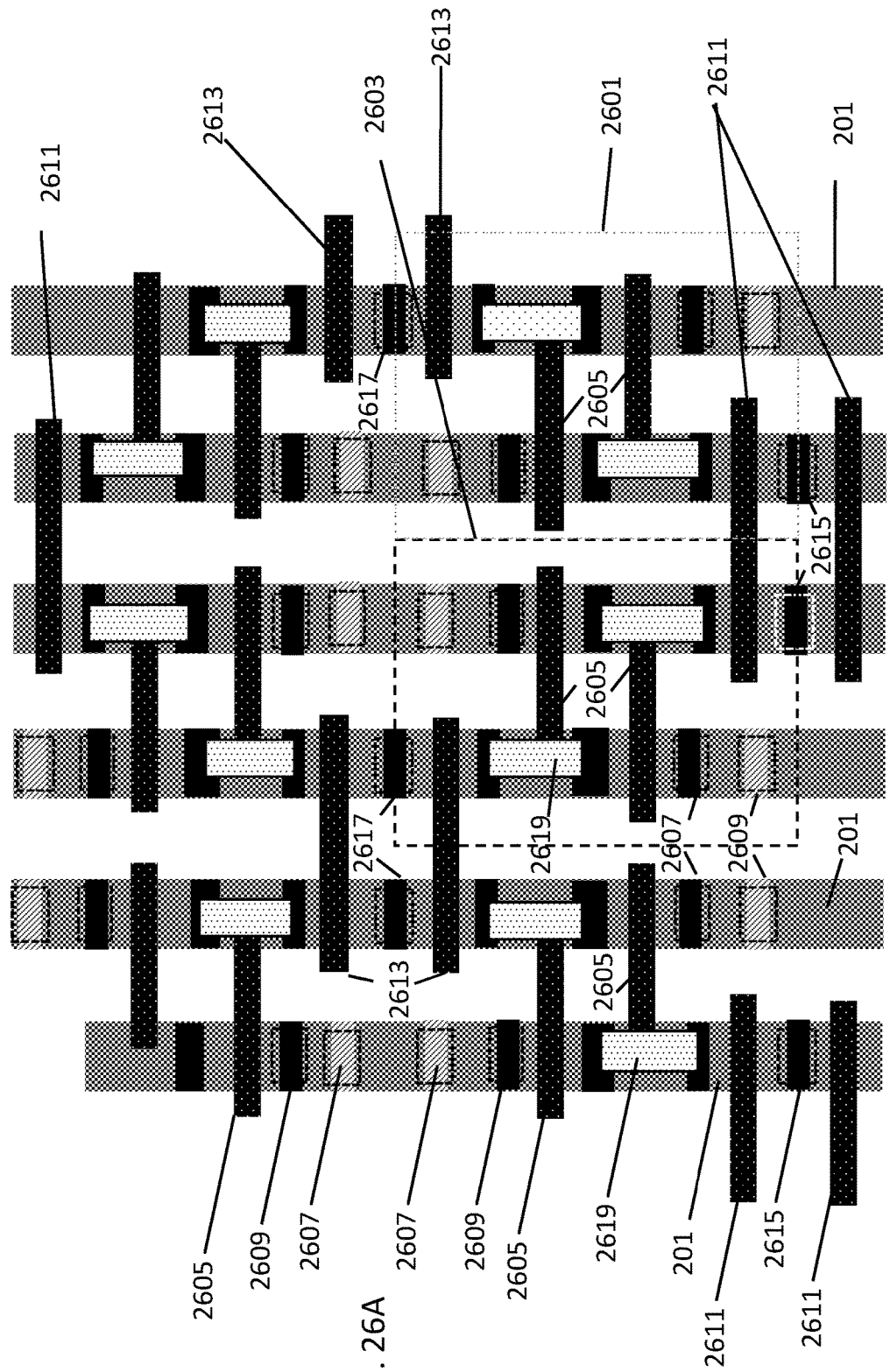
FIGS. 26A and 26B illustrate a plan view of a stacked FinFET device SRAM layout, in accordance with an exemplary embodiment.
Figure 26B:
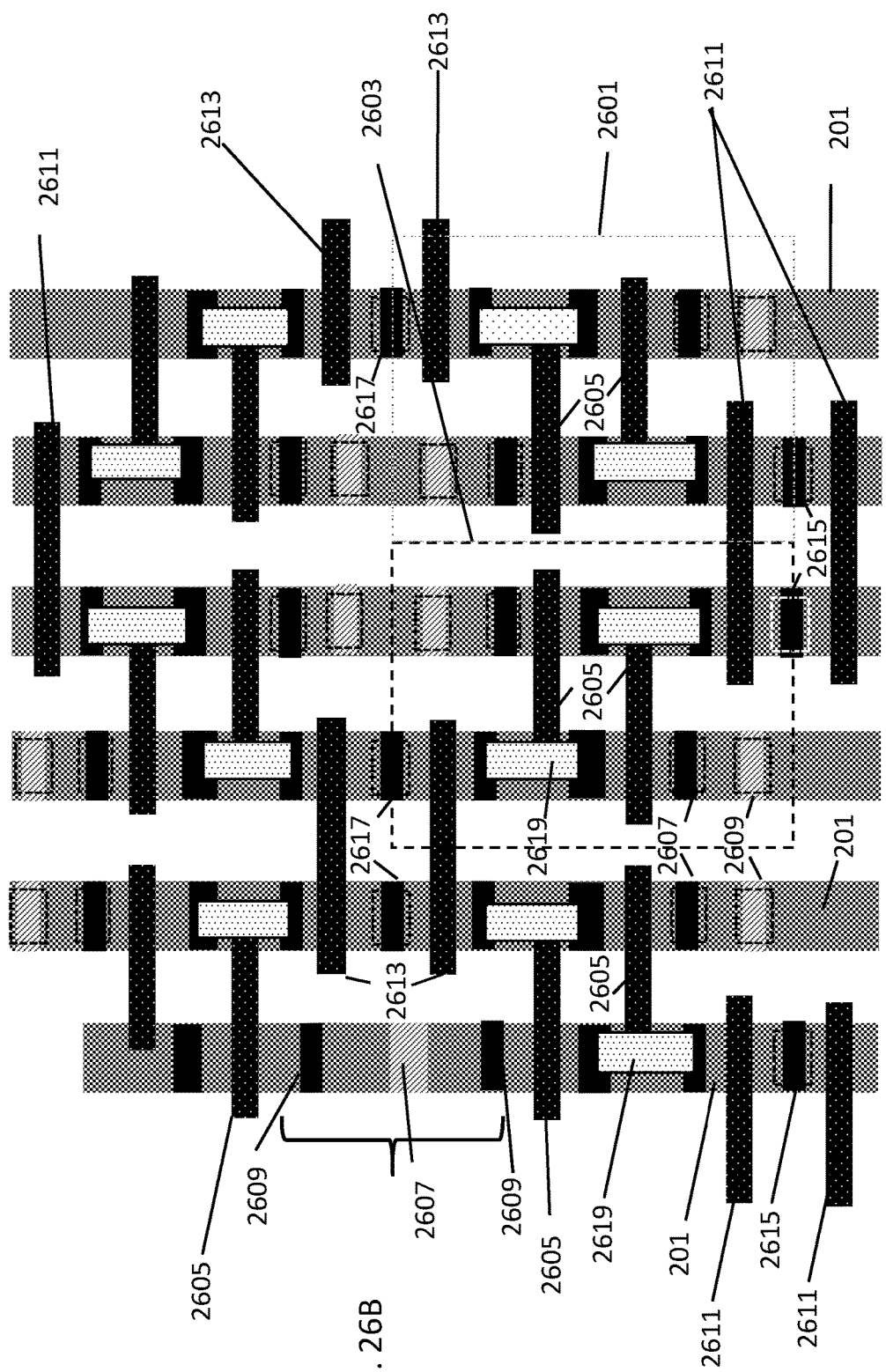

FIG. 26A illustrates an example of a stacked FinFET device SRAM layout which includes bitcells 2601 and 2603 each having a cell area of 8 $unit^2$ with a two fin pitch and four gate pitch. Gates 2605 extend over six fins 201. Power supply voltage contacts (Vdd) for the drain 2607 and ground contacts (Vss) 2609 for source are shown between gates 2605. Multiple contacts may be disposed between gates 2605 in certain embodiments, while other examples have shared Vdd power contacts 2607 (FIG. 26B) or shared Vss ground contacts 2609. Further illustrated are gates 2611 for write-lines-right (WLR) and gates 2613 for write-lines-left (WLL). Bit lines right (BLR) 2615 are disposed between gates 2611 for WLR. Bit lines left (BLL) 2617 are disposed between gates 2613 for WLL. Contacts 2619 are contacts to active regions such as S/D regions. The stacked FinFET device SRAM layout illustrated in FIG. 26A represents a 33% reduction in bitcell area compared to conventional devices. FIG. 26B is the same layout as FIG. 26A, but illustrates a shared Vdd power contact 2607.

Figure 27:
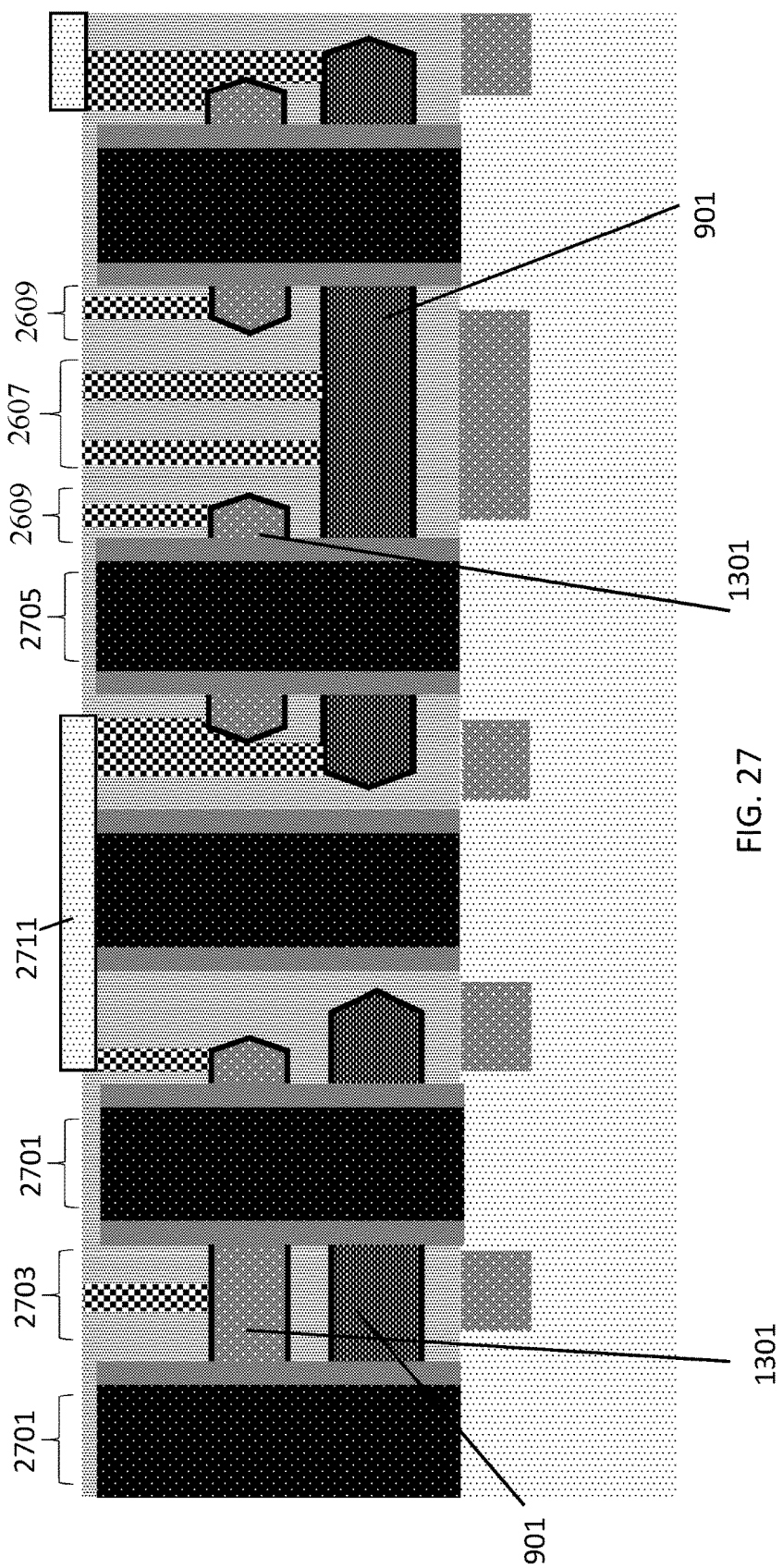
FIG. 27 illustrates a cross-sectional view of a stacked FinFET device with contact scheme, in accordance with an exemplary embodiment.
Figure 28B:
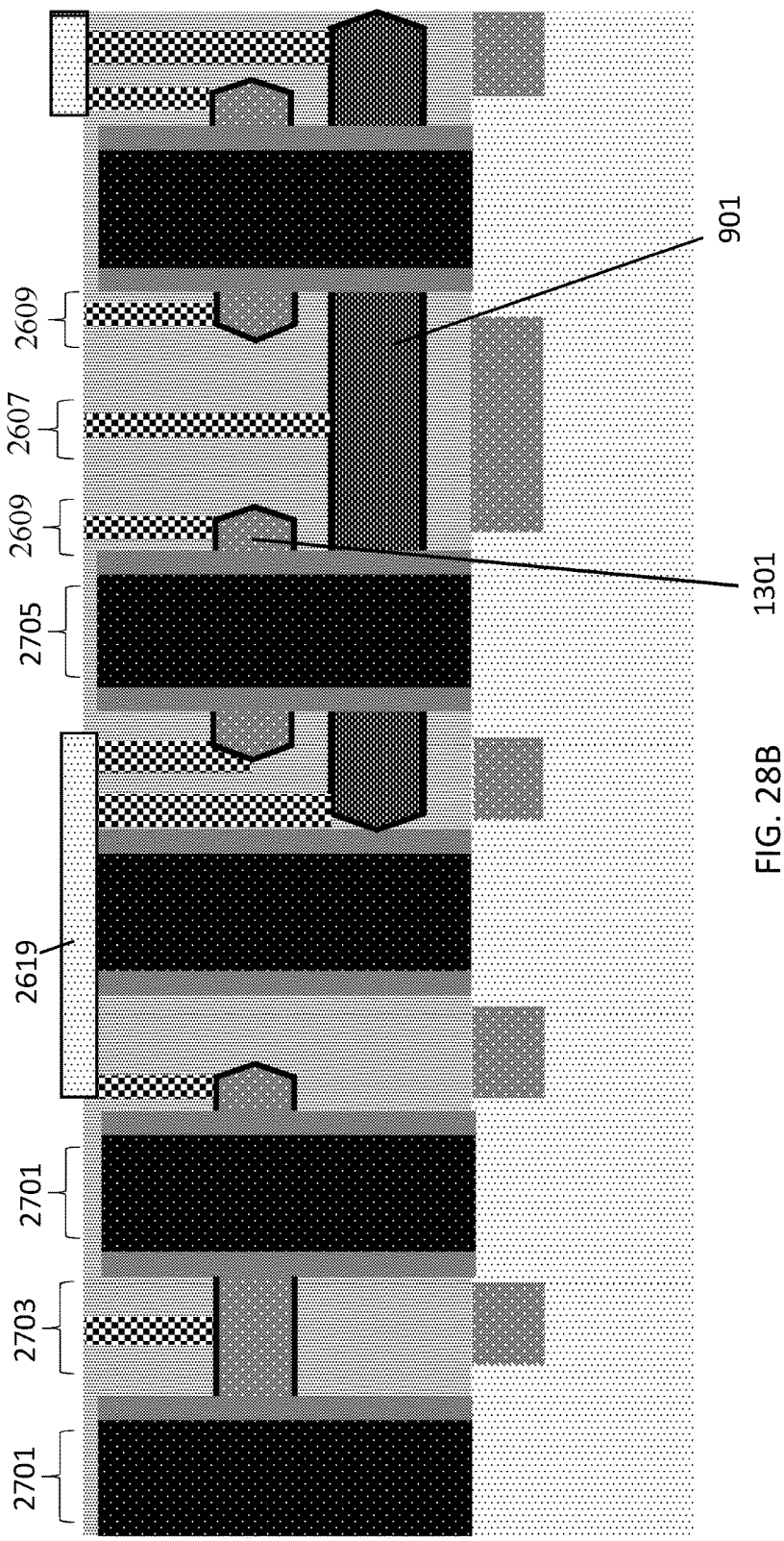
FIG. 28B illustrates a cross-sectional view of a stacked FinFET device with another contact scheme, in accordance with an exemplary embodiment.

Referring to FIG. 27, a cross-sectional view of a stacked FinFET device with contact scheme is illustrated. Two power supply voltage contacts (Vdd) 2607 for the PFET S/D regions 901, and two ground contacts (Vss) 2609 for the NFET S/D regions 1301 are shown in this example. Whereas, in the example of FIG. 28A, one power supply voltage contact (Vdd) 2607 for the PFET S/D regions 901 is shared. The size of the Vdd power contact 2607 can be substantially the same size as each Vss ground contact 2609 or larger in size. Internal node 2711 provides cross-coupling from a source side to the gate. FIG. 28B, illustrates two contacts (in contrast to a fatter contact (FIG. 28A) partially on PFET and NFET) one for NFET 1301 and other for PFET 901 and joining them to the pass gate contact using another level of metal layer.

Figure 29A:
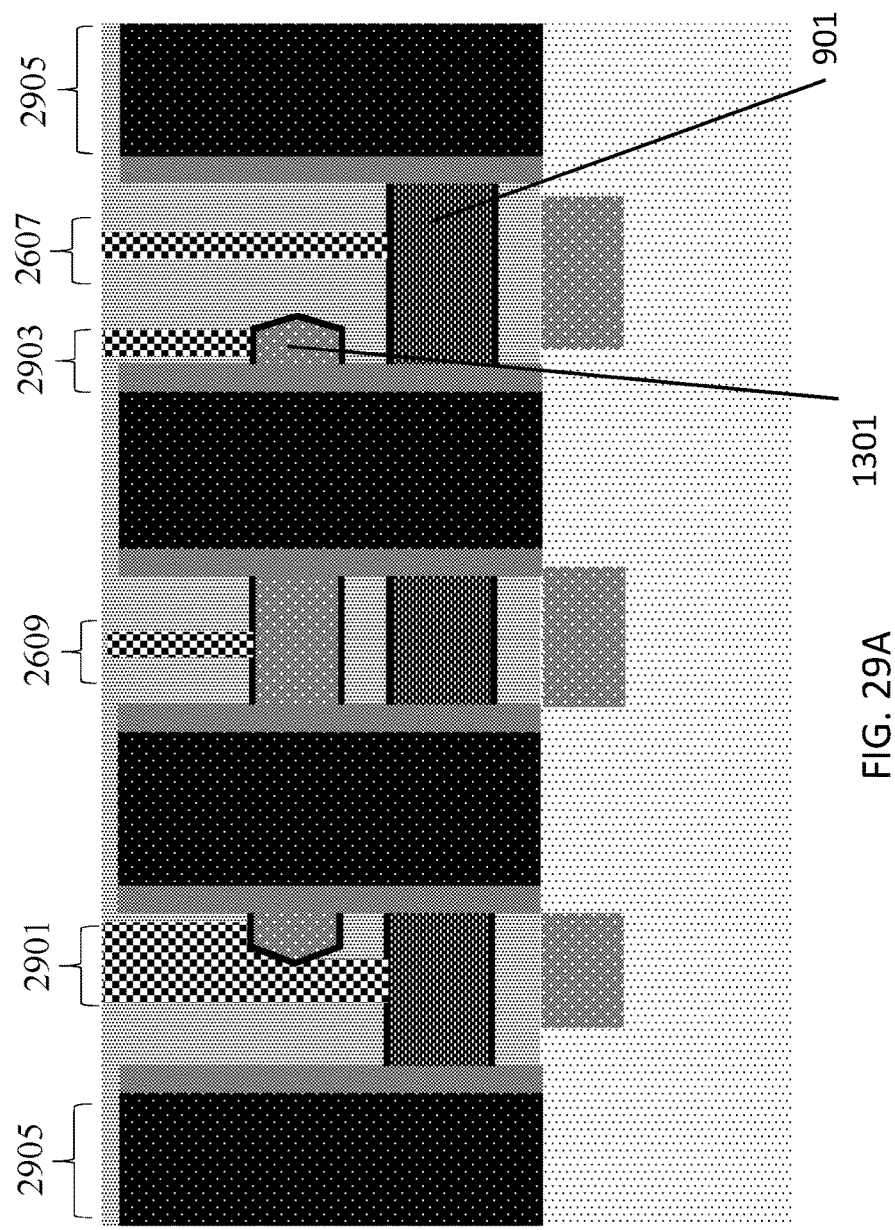
FIGS. 29A and 30 illustrate cross-sectional views of a stacked FinFET device with NOR logic gate, in accordance with other exemplary embodiments.
Figure 30:
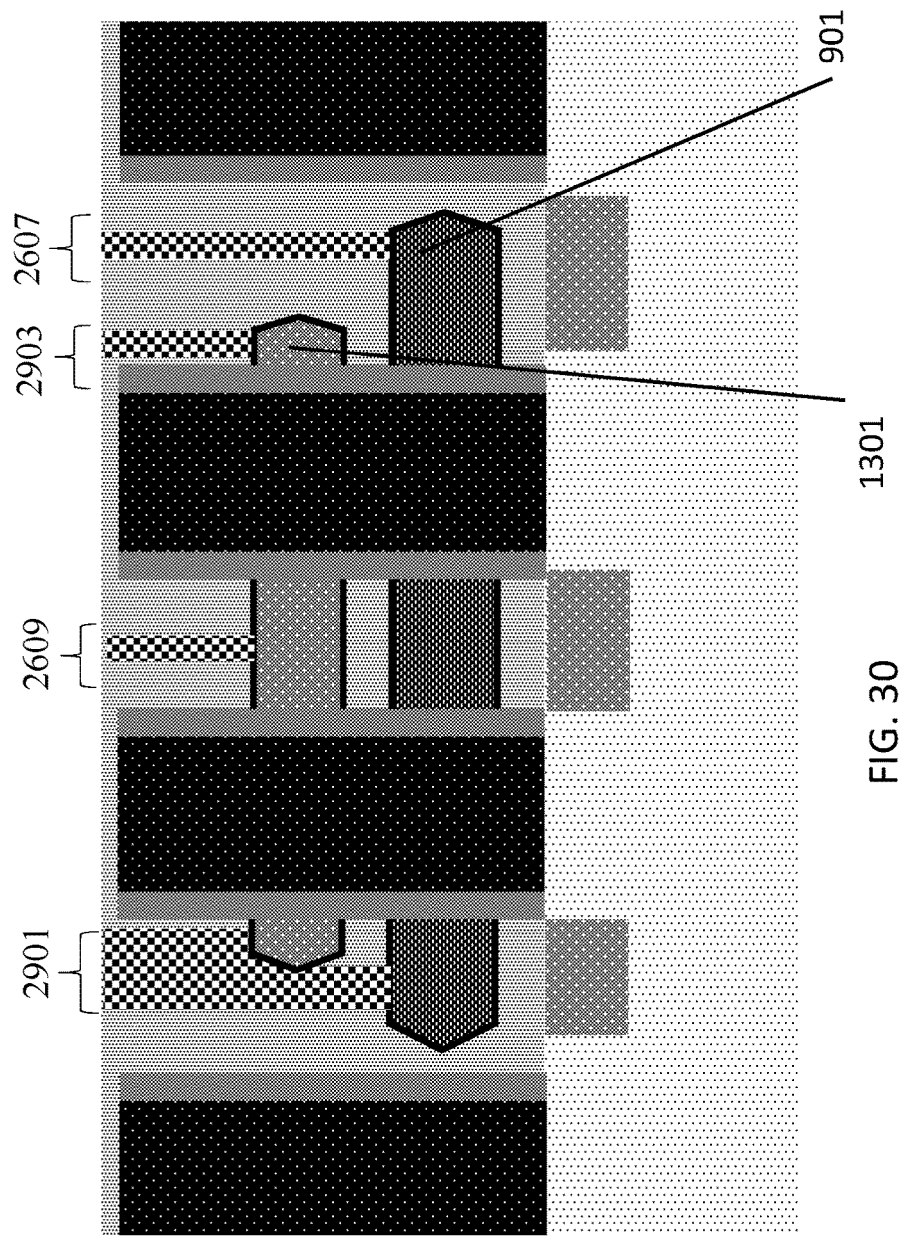

FIG. 29A illustrates a cross-sectional view of a stacked FinFET with NOR gate. In this embodiment, the NOR gate layout has an area of 2.5 unit$^2$ when the NFET is stacked on top of the PFET and is configured as a two input NOR gate using only one fin. The NOR gate can be made with a single or double diffusion break. In an alternative embodiment, the NOR gate layout has an area of 4 unit$^2$ when the PFET is stacked on top of the NFET. Vout contact 2901 extends down to both PFET S/D regions 901 and NFET S/D regions 1301. Vout contact 2903 extends down to NFET S/D regions 1301. Auxiliary gates 2905 are disposed on both ends. FIG. 30 illustrates a cross-sectional view of a stacked FinFET with NOR gate, in accordance with another exemplary embodiment. With the structural design layout of FIG. 29B, a shared internal node is 2911 which connects top PFET and bottom NFET S/D regions and acts as an output node. FIG. 29B illustrates a top view of a stacked FinFET (PFET on top) with NOR gate; and FIG. 29C illustrates a top view of a stacked FinFET (NFET on top) with NOR gate.

Figure 31:
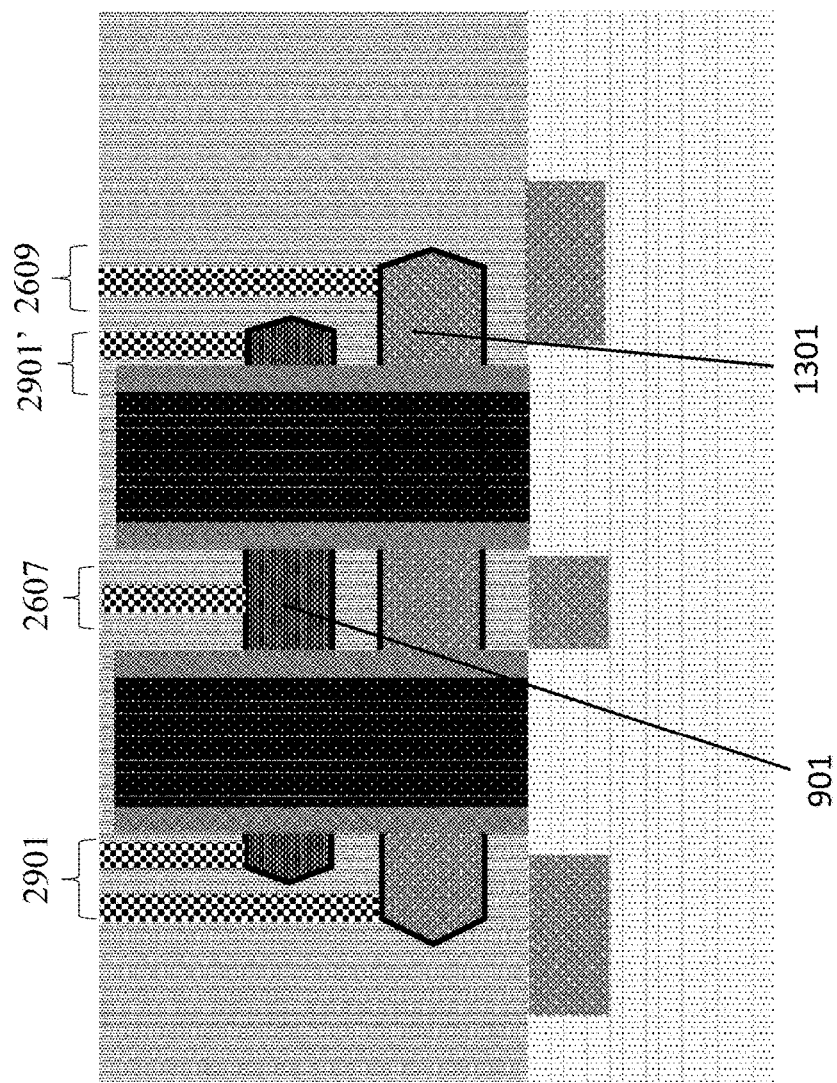
FIGS. 31 and 32 illustrate cross-sectional views of a stacked FinFET device with NAND logic gate, in accordance with other exemplary embodiments.
Figure 32:
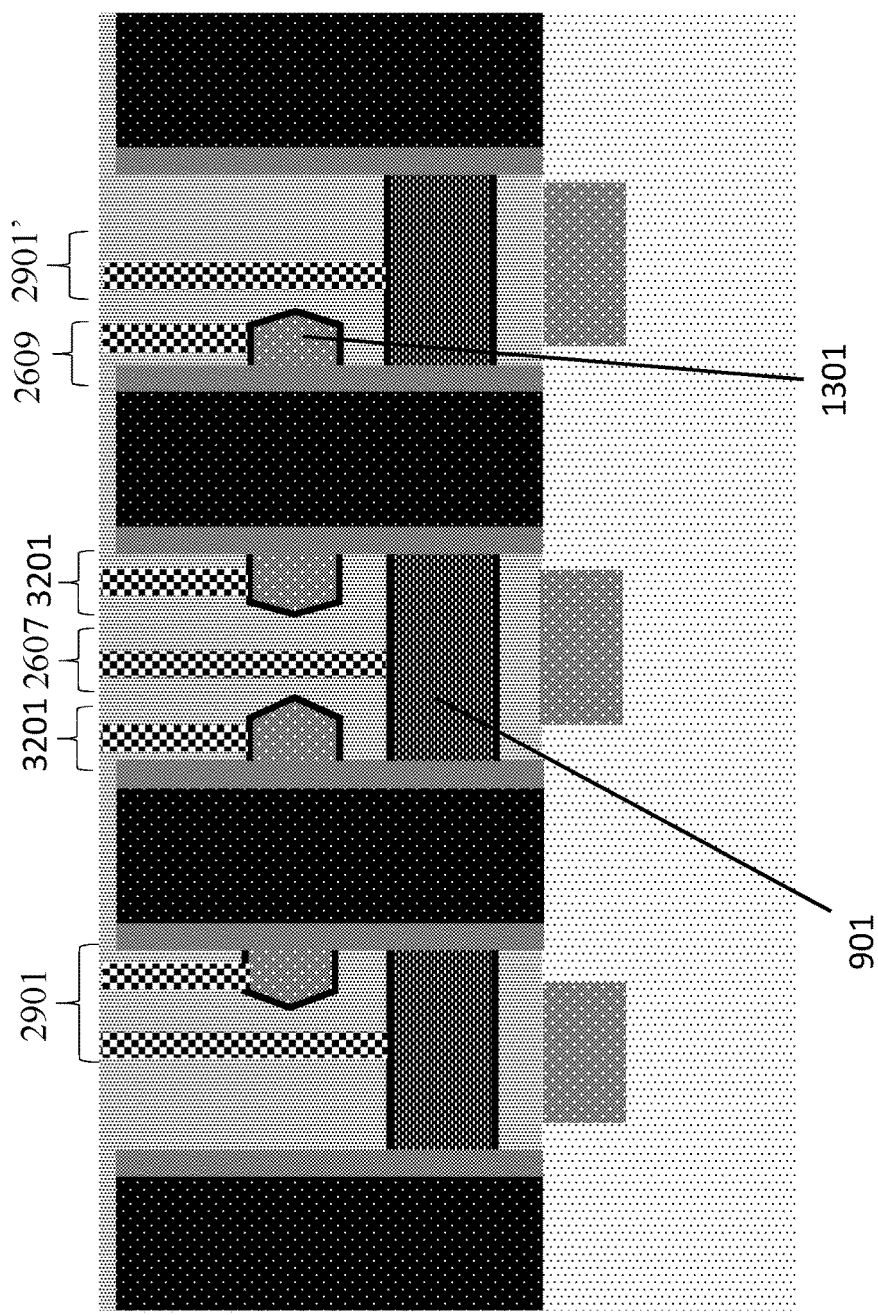

In FIGS. 31 and 32, cross-sectional views of a stacked FinFET with NAND logic gate are illustrated. In the embodiment of FIG. 31, the NAND gate layout has an area of 2.5 unit$^2$ when the PFET is stacked on top of the NFET. In FIG. 31, Vout contact 2901 extends down to both PFET S/D regions 901 and NFET S/D regions 1301, Vout contact 2901' extends down to PFET S/D regions 901 and the Vss ground contact 2609 extends down to NFET S/D regions 1301.

In FIG. 32A, the NAND logic gate layout has an area of 4 unit$^2$ when the NFET is stacked on top of the PFET. In the embodiment of FIG. 32, the NAND gate layout has an area of 4 unit$^2$ when the NFET is stacked on top of the PFET. In FIG. 32, Vout contacts 2901 extend down to both PFET S/D regions 901 and NFET S/D regions 1301, Vout contact 2901' extends down to NFET S/D regions 1301 and the Vss ground contact 2609 extends down to NFET S/D regions 1301. Vdd contact 2607 extends down to PFET S/D regions 901. Nodes 3201 connect with a M1 metal layer. FIGS. 33A and 33B illustrate a top view of a stacked FinFET (PFET on top) with NAND gate; and FIGS. 33C and 33D illustrate a top view of a stacked FinFET (NFET on top) with NAND gate.

The embodiments of the present disclosure can achieve several technical effects, including providing a reduced area layout for a memory device, including SRAM. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in a variety of SRAM devices and other logic circuits in advanced technology nodes, including 7 nanometers nm and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first field effect transistor (FET) over a substrate;
    forming an insulating material over the first FET;
    forming a second FET over the insulating material;
    patterning the first FET, insulating material and second FET to form fins over the substrate of a static random-access memory (SRAM) cell, a negated or (NOR) flash memory cell or a negative-and (NAND) flash memory cell;
    forming an insulating material between the substrate and the PFET;
    forming shallow trench isolation (STI) regions between the fins;
    forming a dummy gate over the fins;
    removing the NFET and insulating material from a portion of the fins down the PFET not covered by the dummy gate;
    forming a dielectric layer over the substrate and removing a portion of the dielectric layer down to the PFET not covered by the dummy gate;
    forming a spacer on side surfaces of the dummy gate;
    removing the dielectric layer;
    removing the PFET not covered by the dummy gate to form a PFET junction cavity between the insulating material and spacer;
    forming silicon germanium (SiGe) in the PFET junction cavity to form p+ source/drain (S/D) regions;
    removing the spacer from the dummy gate;
    forming a second dielectric over the substrate;
    removing a portion of the second dielectric layer down to the NFET covered by the dummy gate to form a NFET junction cavity;
    forming silicon phosphorous (SiP) in the NFET junction cavity to form n+ S/D regions;
    removing the second dielectric layer; and
    performing silicidation of the p+ S/D regions and n+ S/D regions,
    wherein a p-channel is formed between the p+ S/D regions under the dummy gate and an n-channel is formed between the n+ S/D regions under the dummy gate, and
    wherein the first FET is a p-channel FET (PFET) and the second FET is a n-channel FET (NFET), or the first FET is a NFET and the second FET is a PFET.

2. The method according to claim 1, further comprising:
    removing the dummy gate;
    forming a high-k dielectric over the fins;
    forming a work function metal over the high-k dielectric; and
    forming a replacement metal gate (RMG) over the work function metal.

3. The method according to claim 2, comprising:
forming a hardmask (HM) over the substrate and RMG;
forming and patterning a photoresist (PR) over the HM;
etching through the HM to form contact vias down to the p+ S/D regions and/or the n+S/D regions; and
filling the contact vias with the PR.

4. The method according to claim 3, comprising:
removing the PR; and
filling the contact vias for the n+ and/or p+ S/D regions with a metal.

5. The method according to claim 4, wherein the p+ S/D regions extend to adjacent RMGs.

6. The method according to claim 4, wherein both the p+ S/D regions and n+ S/D regions extend to adjacent RMGs and the metal filled contact vias contact the n+ S/D regions.

7. A method comprising:
forming a first field effect transistor (FET) over a substrate;
forming an insulating material over the first FET;
forming a second FET over the insulating material;
patterning the first FET, insulating material and second FET to form fins over the substrate;
forming an insulating material between the substrate and the first FET;
forming isolation regions between the fins;
forming a dummy gate over the fins;
removing the second FET and insulating material from a portion of the fins down the first FET not covered by the dummy gate;
forming a dielectric layer over the substrate and removing a portion of the dielectric layer down to the first FET not covered by the dummy gate;
forming a spacer on side surfaces of the dummy gate;
removing the dielectric layer;
removing the first FET not covered by the dummy gate to form a first FET junction cavity between the insulating material and spacer;
forming first source/drain (S/D) regions in the first FET junction cavity;
removing the spacer from the dummy gate;
forming a second dielectric over the substrate;
removing a portion of the second dielectric layer down to the second FET covered by the dummy gate to form a second FET junction cavity;
forming second S/D regions in the second FET junction cavity; and
removing the second dielectric layer.

8. The method according to claim 7, wherein:
the first FET is a p-channel FET (PFET) and the second FET is a n-channel FET (NFET), or
the first FET is a NFET and the second FET is a PFET.

9. The method according to claim 7, wherein a p-channel is formed between the first S/D regions under the dummy gate and an n-channel is formed between the second S/D regions under the dummy gate.

10. The method according to claim 7, further comprising:
performing silicidation of the first and second S/D regions.

* * * * *